United States Patent
Yang et al.

(10) Patent No.: US 10,121,939 B2
(45) Date of Patent: Nov. 6, 2018

(54) SEMICONDUCTOR LIGHT-EMITTING DEVICES AND METHODS OF MANUFACTURING THE SAME

(71) Applicant: Samsung Electronics Co., Ltd., Suwon-si, Gyeonggi-do (KR)

(72) Inventors: Seong-seok Yang, Hwaseong-si (KR); Jin-bock Lee, Hwaseong-si (KR); Jung-hee Kwak, Daegu (KR); Jung-kyu Park, Seoul (KR); Jung-sung Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 23 days.

(21) Appl. No.: 15/626,410

(22) Filed: Jun. 19, 2017

(65) Prior Publication Data

US 2017/0365745 A1   Dec. 21, 2017

(30) Foreign Application Priority Data

Jun. 21, 2016   (KR) .................. 10-2016-0077562

(51) Int. Cl.
 *H01L 33/44*   (2010.01)
 *H01L 33/36*   (2010.01)

(52) U.S. Cl.
 CPC .............. *H01L 33/44* (2013.01); *H01L 33/36* (2013.01)

(58) Field of Classification Search
 CPC ......... H01L 33/36; H01L 33/48; H01L 33/52; H01L 33/10; H01L 33/405; H01L 33/42; H01L 33/44; H01L 33/50; H01L 33/58
 See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,956,240 B2 | 10/2005 | Yamazaki et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,119,372 B2 | 10/2006 | Stokes et al. |
| 7,154,124 B2 | 12/2006 | Han et al. |

(Continued)

FOREIGN PATENT DOCUMENTS

KR   101328477 B1   11/2013

*Primary Examiner* — Selim Ahmed
(74) *Attorney, Agent, or Firm* — Harness, Dickey & Pierce, PLC

(57) ABSTRACT

A semiconductor light-emitting device may include an emission structure, a protection pattern layer on a limited region of the emission structure, and an insulating pattern layer on the emission structure. The protection pattern layer may expose a separate remaining region of the emission structure, and the first insulating pattern layer may cover at least the remaining region of the emission structure. The insulating layer may include an opening that exposes at least a portion of a surface of the protection pattern layer, such that the emission structure remains covered by at least one of the insulating layer and the protection pattern layer.

20 Claims, 29 Drawing Sheets

(56) References Cited

U.S. PATENT DOCUMENTS

| | | |
|---|---|---|
| 7,166,483 B2 | 1/2007 | Liu et al. |
| 7,208,725 B2 | 4/2007 | Sherrer et al. |
| 7,288,758 B2 | 10/2007 | Sherrer et al. |
| 7,291,865 B2 | 11/2007 | Kojima et al. |
| 7,319,044 B2 | 1/2008 | Han et al. |
| 7,375,380 B2 | 5/2008 | Asahara et al. |
| 7,501,656 B2 | 3/2009 | Han et al. |
| 7,541,734 B2 | 6/2009 | Yamazaki et al. |
| 7,700,962 B2 | 4/2010 | McKenzie et al. |
| 7,709,857 B2 | 5/2010 | Kim et al. |
| 7,759,140 B2 | 7/2010 | Lee et al. |
| 7,763,882 B2 | 7/2010 | Noh et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,393,930 B2 | 3/2013 | Kang et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,637,886 B2 | 1/2014 | Tsuji |
| 8,735,931 B2 | 5/2014 | Han et al. |
| 8,766,295 B2 | 7/2014 | Kim |
| 8,772,804 B2 | 7/2014 | Ahlstedt et al. |
| 8,823,031 B2 | 9/2014 | Kususe et al. |
| 2008/0173885 A1 | 7/2008 | Kuromizu |
| 2013/0069095 A1 | 3/2013 | Hodota |
| 2014/0042487 A1* | 2/2014 | Jeong ............ H01L 33/36 257/99 |
| 2015/0054422 A1* | 2/2015 | Koo ............ H05B 33/0872 315/250 |
| 2016/0181477 A1* | 6/2016 | Lee ............ H01L 33/40 257/98 |

\* cited by examiner

| OPTICAL EFFICIENCY (ARBITRARY UNIT) | | DIAMETER OF PROTECTION PATTERN | | |
|---|---|---|---|---|
| | | D1 | D2 | D3 |
| PITCH OF PROTECTION PATTERNS | P1 | 206.906 | 208.267 | 208.858 |
| | P2 | 207.498 | 207.916 | 207.988 |
| | P3 | 207.143 | 207.147 | 206.975 |

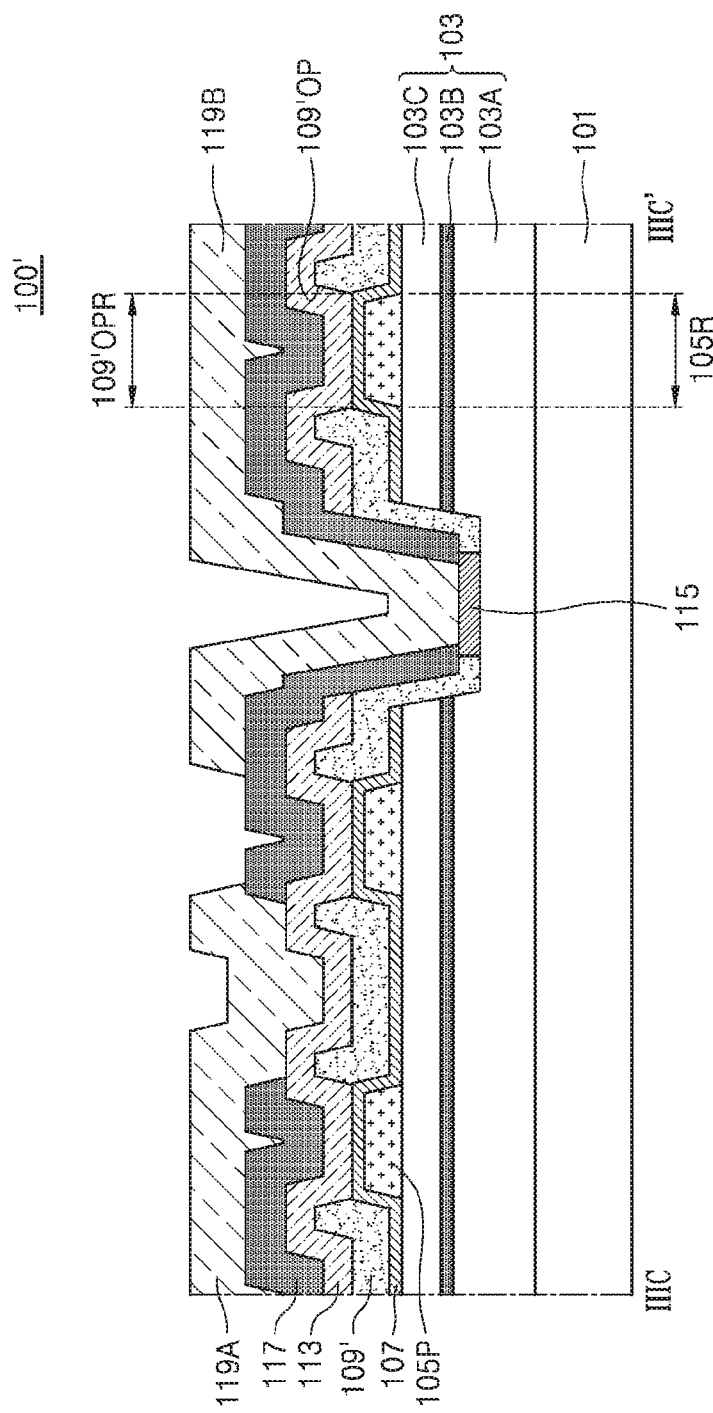

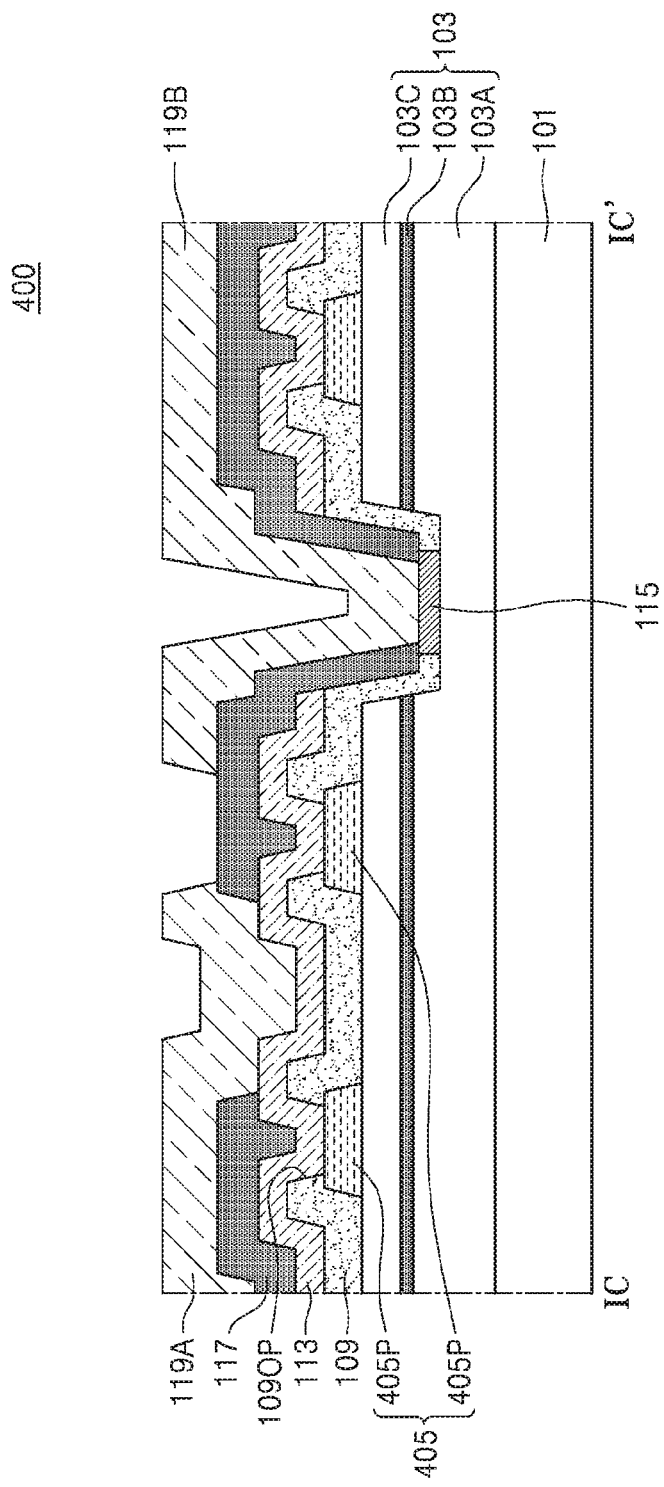

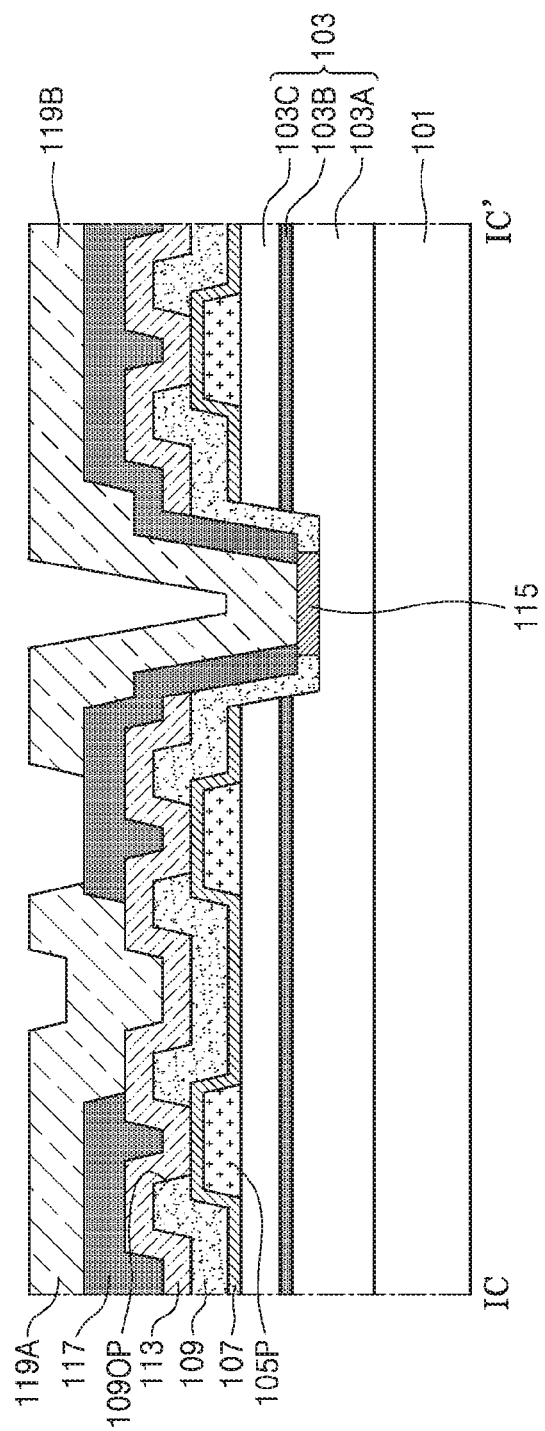

SEMICONDUCTOR LIGHT-EMITTING DEVICES AND METHODS OF MANUFACTURING THE SAME

CROSS-REFERENCE TO RELATED APPLICATIONS

This U.S. non-provisional patent application claims priority under 35 U.S.C. § 119 of Korean Patent Application No. 10-2016-0077562, filed on Jun. 21, 2016, in the Korean Intellectual Property Office, the disclosure of which is incorporated herein in its entirety by reference.

BACKGROUND

The inventive concepts relate to semiconductor light-emitting devices, and more particularly, to semiconductor light-emitting devices including a reflective electrode layer on a semiconductor layer.

Since a light-emitting diode (LED), which is a type of semiconductor light-emitting device, has a relatively long lifespan, low power consumption, high response speed, and environmental friendliness, the LED has been used as a light source for various products, such as a lighting apparatus or a backlight unit (BLU) of a display device. Thus, it may be necessary to develop light-emitting device packages having high light extraction efficiency and reliability.

SUMMARY

According to some example embodiments, a semiconductor light-emitting device may include: an emission structure including a first semiconductor layer, a second semiconductor layer, and an active layer between the first semiconductor layer and the second semiconductor layer; a protection pattern layer on a limited region of the emission structure, such that the protection pattern layer exposes a separate remainder region of the emission structure; a first insulating pattern layer on the emission structure, the first insulating pattern layer including an opening exposing a portion of the protection pattern layer such that the emission structure is covered by at least one of the first insulating layer and the protection pattern layer; and an electrode layer on the exposed portion of the protection pattern layer surface, the electrode layer further being on the first insulating pattern layer.

According to some example embodiments, a semiconductor light-emitting device may include: an emission structure; a protection pattern layer on a limited region of the emission structure, the protection pattern layer exposing a separate remainder region of the emission structure; an insulating pattern layer on the emission structure and the protection pattern layer, the insulating pattern including an opening exposing a portion of a surface of the protection pattern layer such that the emission structure is covered by at least one of the insulating pattern layer and the protection pattern layer; and an electrode layer on the exposed portion of the surface of the protection pattern layer, the electrode layer further on the insulating pattern layer.

According some example embodiments, a method of manufacturing a semiconductor light-emitting device may include: forming an emission structure, the emission structure including a first semiconductor layer, a second semiconductor layer, and an active layer between the first semiconductor layer and the second semiconductor layer; forming a protection pattern layer on a limited region of the second semiconductor layer, such that the protection pattern layer exposes a separate remainder region of the second semiconductor layer; etching a limited portion of the emission structure to expose a limited portion of the first semiconductor layer; forming an insulating layer on the second semiconductor layer and the protection pattern layer; forming an opening in the insulating layer in a direction substantially perpendicular to a top surface of the emission structure, the insulating layer opening exposing at least a partial region of the protection pattern layer, such that the emission structure remains covered by at least one of the insulating layer and the protection pattern layer; and forming an electrode layer in the opening and on the insulating layer.

In some example embodiments, a semiconductor light-emitting device may include: an emission structure; a protection pattern layer on a limited region of the emission structure, such that the protection pattern layer exposes a separate remainder region of the emission structure; and an insulating pattern layer on the emission structure, the insulating pattern layer including an opening exposing a portion of the protection pattern layer, such that the emission structure is covered by at least one of the first insulating layer and the protection pattern layer.

BRIEF DESCRIPTION OF THE DRAWINGS

Example embodiments of the inventive concepts will be more clearly understood from the following detailed description taken in conjunction with the accompanying drawings in which:

FIG. 3C is a cross-sectional view taken along a line IIIC-IIIC' of FIG. 3A;

FIG. 6 is a cross-sectional view taken along the line IC-IC' of FIG. 1A, illustrating a structure of the semiconductor light-emitting device according to some example embodiments;

FIG. 8C, FIG. 9C, FIG. 10C, FIG. 11C, and FIG. 12B are cross-sectional views corresponding to the lines IC-IC' of FIG. 8A, FIG. 9A, FIG. 10A, FIG. 11A, and FIG. 12A, respectively;

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

Figure 1A:
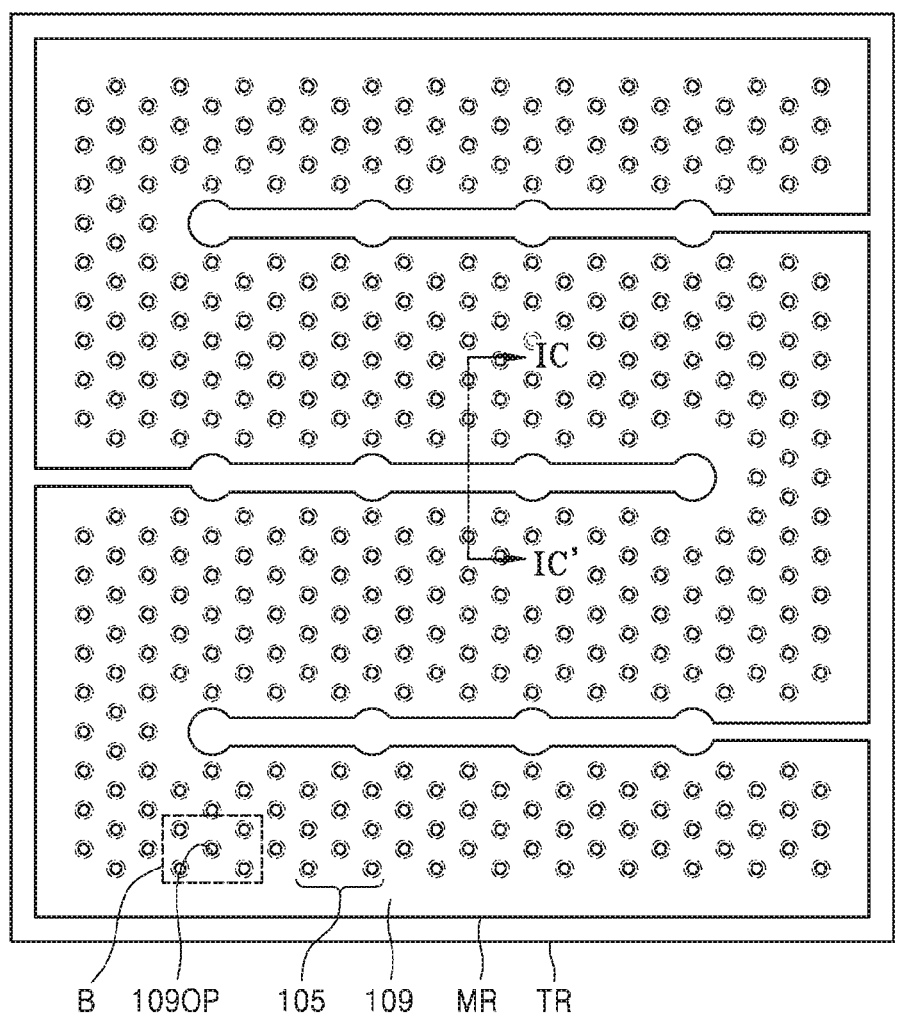
FIG. 1A is a plan view of a semiconductor light-emitting device according to some example embodiments.
Figure 1B:
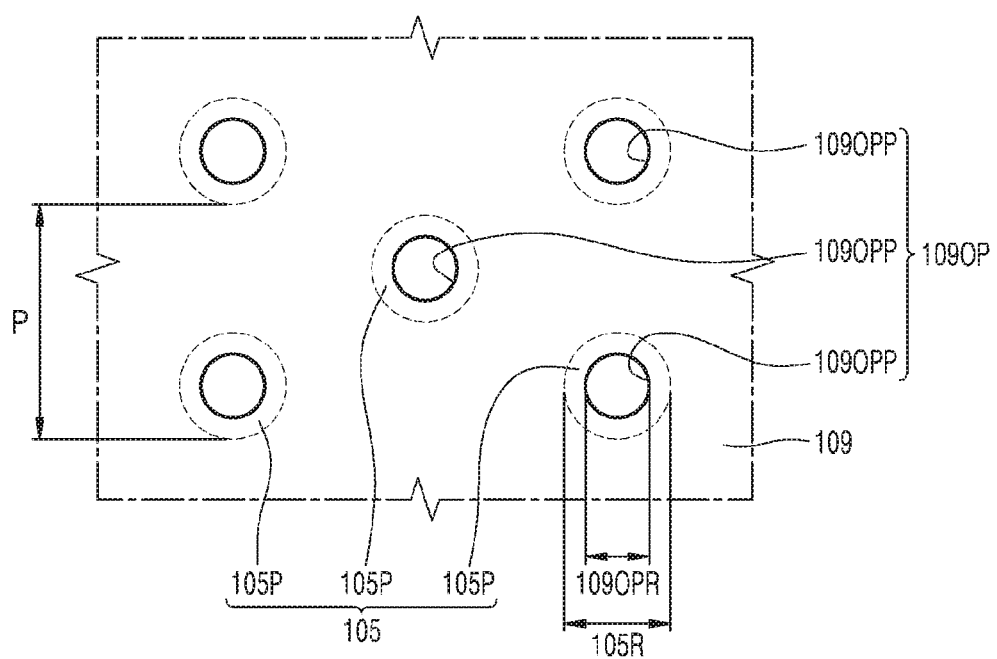
FIG. 1B is an enlarged view of a portion B of FIG. 1A.
Figure 1C:
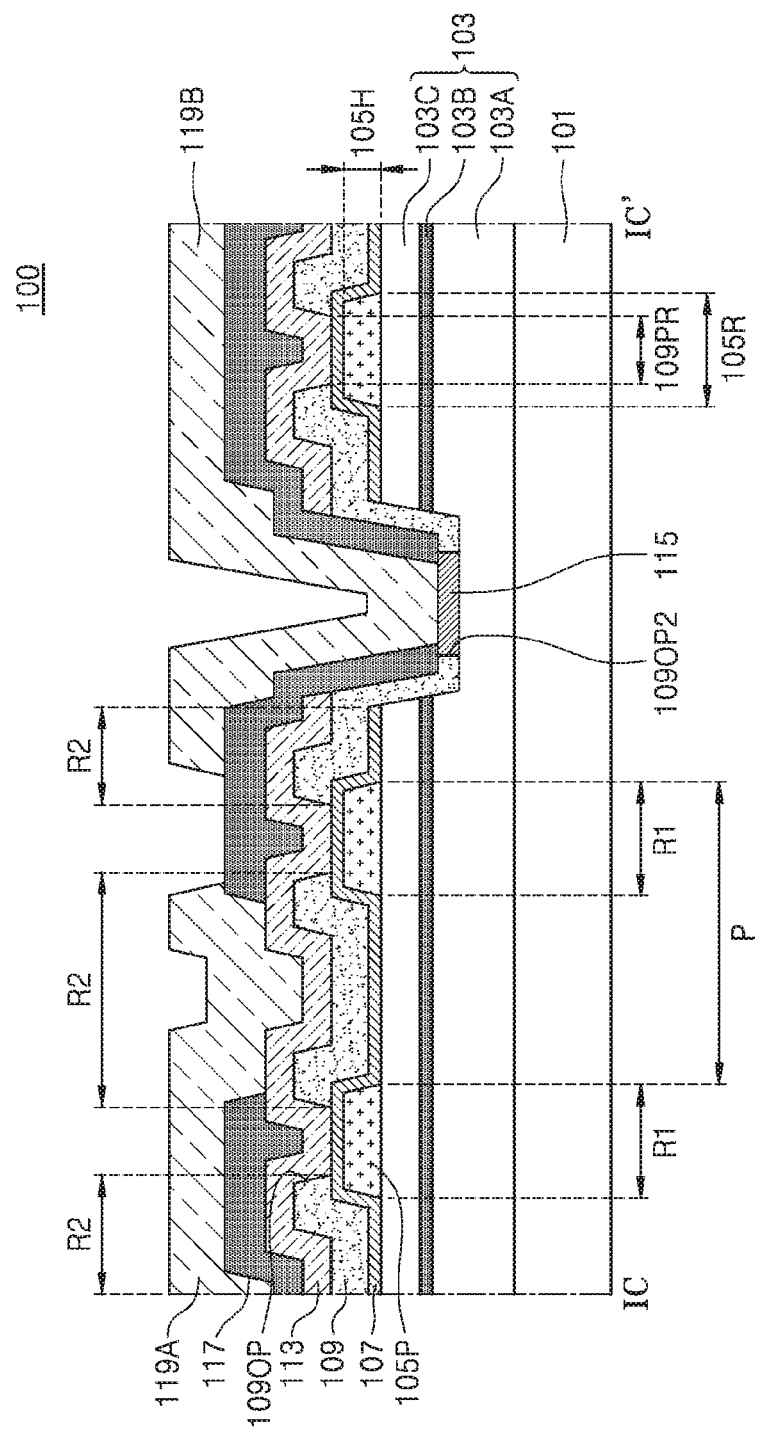
FIG. 1C is a cross-sectional view taken along a line IC-IC' of FIG. 1A.

FIG. 1A is a plan view of a semiconductor light-emitting device 100 according to some example embodiments. FIG. 1B is an enlarged view of a portion B of FIG. 1A. FIG. 1C is a cross-sectional view taken along a line IC-IC' of FIG. 1A. The same reference numerals are used to denote the same elements, and repeated descriptions thereof will be simplified. Since various elements and regions are approximately illustrated in the drawings, the scope of the inventive concepts is not limited by relative sizes or intervals in the drawings.

Referring to FIGS. 1A to 1C, the semiconductor light-emitting device 100 may include a substrate 101, an emission structure 103 formed on the substrate 101, a protection pattern layer 105 formed on a partial region of the emission structure 103, and a first insulating pattern layer 109 formed on the emission structure. The first insulating pattern layer 109 may include a first opening 109OP located on at least a portion of the protection pattern layer 105 (e.g., a portion of a surface of the protection pattern layer 105), such that the first insulating pattern layer 109 exposes the portion of the protection pattern layer 105. A first electrode layer 113 may be formed in the first opening 109OP and on the first insulating pattern layer 109. A region of a top surface of the emission structure 103, which may overlap with the first opening 109OP, may be covered by the protection pattern layer 105, such that the emission structure 103 is covered by at least one of the first insulating pattern layer 109 and the protection pattern layer 105. The protection pattern layer 105 may include a plurality of separate protection patterns 105P.

The substrate 101 may include a transparent substrate. For example, the substrate 101 may include sapphire ($Al_2O_3$), gallium nitride (GaN), silicon carbide (SiC), gallium oxide ($Ga_2O_3$), lithium gallium oxide ($LiGaO_2$), lithium aluminum oxide ($LiAlO_2$), or magnesium aluminum oxide ($MgAl_2O_4$).

The emission structure 103 may be a structure in which a first semiconductor layer 103A, an active layer 103B, and a second semiconductor layer 103C are sequentially stacked on the substrate 101. The emission structure 103 may include a trench region TR located on the first semiconductor layer 103A and a mesa region MR located on the second semiconductor layer 103C at a higher level than the trench region TR.

Each of the first and second semiconductor layers 103A and 103C may include a gallium nitride (GaN)-based compound semiconductor, for example, $Al_xIn_yGa_{(1-x-y)}N$ (0<x<1, 0<y<1, 0<x+y<1). However, in addition to the GaN-based compound semiconductor, each of the first and second semiconductor layers 103A and 103C may include a gallium arsenide (GaAs)-based semiconductor or a gallium phosphide (GaP)-based semiconductor. Each of the first semiconductor layer 103A, the active layer 103B, and the second semiconductor layer 103C may be an epitaxial layer.

The first and second semiconductor layers 103A and 103C may include an n-type doped semiconductor and a p-type doped semiconductor, respectively. The first semiconductor layer 103A may include an n-type GaN layer configured to supply electrons to the active layer 103B in response to the supply of power. The n-type GaN layer may include n-type impurities including a Group IV element. The n-type impurities may include silicon (Si), germanium (Ge), or tin (Sn).

In some example embodiments, the second semiconductor layer 103C may include a p-type GaN layer configured to supply holes to the active layer 103B in response to the supply of power. The p-type GaN layer may include p-type impurities including a Group II element. In some example embodiments, the p-type impurities may include magnesium (Mg), zinc (Zn), or beryllium (Be).

The active layer 103B interposed between the first and second semiconductor layers 103A and 103C may emit light associated with a desired (or, alternatively, predetermined) amount of energy, wavelength, frequency, some combination thereof, or the like, due to recombination between electrons and holes. The active layer 103B may have a structure formed by alternately stacking a quantum well layer and a quantum barrier layer at least once. The quantum well layer may have a single quantum well structure or a multi-quantum well structure. In some example embodiments, the active layer 103B may include u-AlGaN. In some other embodiments, the active layer 103B may have a multiple quantum well (MQW) structure including GaN/AlGaN, InAlGaN/InAlGaN, or InGaN/AlGaN. To increase luminous efficiency of the active layer 103B, the depth of a quantum well, the stacked number of pairs of quantum well layers and quantum barrier layers, and the thicknesses of the quantum well layers and the quantum barrier layers may be changed in the active layer 103B.

In some example embodiments, the emission structure 103 may be formed by using (e.g., "according to") a metal-organic chemical vapor deposition (MOCVD) process, a hydride vapor phase epitaxy (HVPE) process, or a molecular beam epitaxy (MBE) process.

Although not shown, a nitride semiconductor thin film may be further formed between the substrate 101 and the emission structure 103. The nitride semiconductor thin film may serve as a buffer layer configured to reduce lattice mismatch between the substrate 101 and the first semiconductor layer 103A.

The protection pattern layer 105 may be formed on a partial region (e.g., a limited region) of the second semiconductor layer 103C of the emission structure 103, such that the protection pattern layer 105 exposes a separate remainder region of the emission structure 103. The protection pattern layer 105 may include a plurality of protection patterns 105P, each of which has an island shape and which are formed apart from one another. The protection patterns 105P may be arranged apart from one another at a constant ("fixed") spatial frequency (e.g., the protection patterns 105P may be spaced apart from each other according to a common interval P, period P, etc.).

A diameter 105R of the protection pattern 105P included in the protection pattern layer 105 may be greater than a diameter 109OPR of the first opening 109OP of the first insulating pattern layer 109. That is, when a bottom surface of the protection pattern 105P is proximate to the top surface of the emission structure 103 and a bottom of the first opening 109OP is proximate to a top surface of the protection pattern 105P (e.g., the top surface of the protection pattern 105P is proximate to the first opening 109OP and distal from the emission structure 103), an area of the bottom surface of the protection pattern 105P may be greater than an area of the bottom of the first opening 109OP. Thus, the protection pattern layer 105 may cover the entire top surface of a portion of the emission structure 103 that overlaps with the first opening 109OP (e.g., an entirety of the top surface of the emission structure 103 that overlaps with the first opening 109OP). The diameter 105R of the protection pattern layers 105 and the pitch P (also referred to herein as "spacing distance," "interval," and "period") between the protection patterns 105P may affect optical efficiency of the semiconductor light-emitting device 100, which will be described below with reference to FIG. 2B. As a result, the emission structure 103 may be covered by at least one of the first insulating pattern layer 109 and the protection pattern layer 105. The protection pattern layer 105 may cover the portion of the emission structure that overlaps the first opening 109OP, such that the protection pattern layer 103 covers the overlapped portion of the emission structure 103 from being exposed by the first opening 109OP.

In some example embodiments, the diameter 105R of a protection pattern 105P included in the protection pattern layer 105 may be substantially equal to (e.g., substantially common with) the diameter 109OPR of the first opening 109OP of the first insulating pattern layer 109. That is, when the bottom surface of the protection pattern 105P faces the top surface of the emission structure 103 and the bottom of the first opening 109OP faces the top surface of the protection pattern, the area of the bottom surface of the protection pattern may be substantially equal (e.g., equal within manufacturing tolerances and/or material tolerances) to the area of the bottom (e.g., bottom aperture) of the first opening 109OP. Thus, the protection pattern layer 105 may cover the entire top surface of the emission structure 103 in which the first opening 109OP is located, which will be described in detail below with reference to FIGS. 3A to 3C.

In some example embodiments, the protection pattern layer 105 may include an insulating material. In some example embodiments, the protection pattern layer 105 may include an insulating material having (e.g., associated with) a lower refractive index than a refractive index with which the second semiconductor layer 103C is associated. Thus, a first region R1 in which the second semiconductor layer 103C is in contact with the protection pattern layer 105 may constitute a high-reflection region due to a difference in refractive index. The first region R1 may reflect light generated by the emission structure 103 at a high reflectance.

In some example embodiments, the first insulating pattern layer 109 may include an insulating material having a lower refractive index than the second semiconductor layer 103C. A second region R2 in which the second semiconductor layer 103C overlaps the first insulating pattern layer 109 may also constitute a high-reflection region due to a difference in refractive index. The second region R2 may reflect light generated by the emission structure 103 at a high reflectance. Thus, the entire region R1 and R2 of the emission structure 103 may be embodied as a high-reflection region so that the semiconductor light-emitting device 100 may have high extraction efficiency.

In some example embodiments, the protection pattern layer 105 may include silicon oxide, silicon nitride, silicon oxynitride, titanium oxide, tantalum oxide, hafnium oxide, zinc oxide, zirconium oxide, aluminum oxide, aluminum nitride, or niobium oxide. In some example embodiments, the protection pattern layer 105 may include a single film or a multilayered structure. In some example embodiments, the protection pattern layer 105 may have a distributed Bragg reflector (DBR) structure, which will be described below with reference to FIGS. 4A and 4B.

A light reflectance of the protection pattern layer 105 may at least partially depend upon a thickness 105H of the protection pattern layer 105, which will be described in detail below with reference to FIG. 2A.

In some example embodiments, the protection pattern layer 105 may include a metal material, for example, silver (Ag), aluminum (Al), chromium (Cr), or a combination thereof. In some example embodiments, the protection pattern layer 105 may be formed by using an e-beam evaporation process, which will be described below with reference to FIGS. 6 and 7.

In some example embodiments, the semiconductor light-emitting device 100 may further include a current diffusion layer 107, which may integrally cover the emission structure 103 and the protection pattern layer 105. In some example embodiments, the first insulating pattern layer 109 may be formed on the current diffusion layer 107 to cover a region of the top surface of the emission structure 103, which is not covered by the protection pattern layer 105, and the first opening 109OP may be located over at least a portion of the protection pattern layer 105. Current supplied from the first electrode layer 113 may diffuse through the current diffusion layer 107 in a direction parallel to the top surface of the emission structure 103 and be supplied to the second semiconductor layer 103C. Since the current diffusion layer 107 is in contact with the second semiconductor layer 103C over a large area, the crowding of current into a specific region may be reduced and/or prevented to improve optical efficiency.

The current diffusion layer 107 may include indium tin oxide (ITO), aluminum zinc oxide (AZO), indium zinc oxide (IZO), zinc oxide (ZnO), ZnO:Ga (GZO), $In_2O_3$, $SnO_2$, CdO, $CdSnO_4$, or $Ga_2O_3$. Although FIG. 1C illustrates a case in which the current diffusion layer 107 is interposed between the emission structure 103 and the protection pattern layer 105, the current diffusion layer 107 may be omitted.

The first insulating pattern layer 109 may include the first opening 109OP and a second opening 109OP2 used to form the first and second electrode layers 113 and 115 and cover the entire surface of the emission structure 103. Specifically, the first opening 109OP of the first insulating pattern layer 109 may be located over (e.g., at least partially overlap with) the protection pattern layer 105, and the first insulating pattern layer 109 may be formed on the current diffusion layer 107 to cover a top surface of the second semiconductor layer 103C, side surfaces of the protection pattern layer 105, and partial edge regions of a top surface of the protection pattern layer 105, such that one or more central regions of the top surface of the protection pattern layer 105 is exposed by the first insulating pattern layer 109.

The first insulating pattern layer 109 may cover the first semiconductor layer 103A, the active layer 103B, and the second semiconductor layer 103C, which are exposed by side surfaces of the mesa region MR. Also, the second opening 109OP2 of the first insulating pattern layer 109 may be located on the first semiconductor layer 103A in the trench region TR. The second electrode layer 115 may be formed in the second opening 109OP2 and electrically coupled to the first semiconductor layer 103A.

The first opening 109OP of the first insulating pattern layer 109 may include a plurality of openings 109OPP corresponding respectively to the plurality of protection patterns 105P included in the protection pattern layer 105 (e.g., a plurality of openings at least partially overlapping with the plurality of protection patterns 105P, respectively). The first electrode layer 113 may be formed in the first opening 109OP and electrically coupled to the second semiconductor layer 103C.

In general, during a process of forming an electrode layer on an emission structure, a semiconductor layer included in the emission structure may react with a material included in the electrode layer. In some example embodiments, since the electrode layer is formed by using a high-energy process, such as a sputtering process or a plasma-enhanced chemical vapor deposition (PECVD) process whereby an electrode material is processed with plasma, the material included in the electrode layer may react with the semiconductor layer or apply physical damage to the semiconductor layer so that an operating voltage of a light-emitting device may rise. It is known that the semiconductor layer may also be damaged when an indium tin oxide (ITO) layer is formed on the semiconductor layer.

In contrast, in the semiconductor light-emitting device 100 according to some example embodiments, the protection pattern layer 105 may be provided on the second semiconductor layer 103C on which the opening 109OP is located. Thus, when the first electrode layer 113 is formed, a path in which a material included in the first electrode layer 113 may react with the second semiconductor layer 103C may be blocked. In other words, when the first electrode layer 113 is formed, a region in which the first opening 109OP is in contact with the material included in the first electrode layer 113 may belong to the protection pattern layer 105 or the current diffusion layer 107 located on the protection pattern layer 105. Thus, the second semiconductor layer 103C may not be damaged by the material included in the first electrode layer 113. As a result, an operating voltage of the semiconductor light-emitting device 100 may be reduced and/or prevented from rising.

The first insulating pattern layer 109 may include an insulating material having a lower refractive index than a refractive index of the second semiconductor layer 103C. Thus, the second region R2 in which the second semiconductor layer 103C overlaps the first insulating pattern layer 109 may constitute a high-reflection region due to a difference in refractive index. As described above, the second region R2 may reflect light generated by the emission structure 103 at a high reflectance.

The first electrode layer 113 may be formed in the first opening 109OP of the first insulating pattern layer 109 and on the first insulating pattern layer 109. The first electrode layer 113 may be electrically coupled to the second semiconductor layer 103C. Also, the first electrode layer 113 may serve to reflect light, which is transmitted through the protection pattern layer 105 and the first insulating pattern layer 109 and arrives at the first electrode layer 113, from among light emitted by the emission structure 103. The first electrode layer 113 may include a metal or alloy having a high reflectance in a wavelength region of light emitted by the emission structure 103. In some example embodiments, the first electrode layer 113 may include silver, aluminum, a combination thereof, or an alloy thereof. In some other embodiments, the first electrode layer 113 may include at least one metal selected from the group consisting of silver (Ag), aluminum (Al), nickel (Ni), gold (Au), titanium (Ti), chromium (Cr), palladium (Pd), copper (Cu), platinum (Pt), tin (Sn), tungsten (W), rhodium (Rh), iridium (Ir), ruthenium (Ru), magnesium (Mg), and zinc (Zn) or an alloy including the at least one metal.

In some example embodiments, the first electrode layer 113 may include a metal layer having both an ohmic characteristic and a light reflection characteristic. For example, the first electrode layer 113 may have a multilayered structure including a first metal film having an ohmic characteristic and a second metal film having a light reflection characteristic. The first metal film may include platinum (Pt), palladium (Pd), nickel (Ni), gold (Au), titanium (Ti), or an alloy or multilayered metal structure including at least one thereof. The second metal film may include silver (Ag), aluminum (Al), or an alloy or multilayered metal structure including at least one thereof. For example, the first electrode layer 113 may have an Ag/Ni/Ti stack structure or a Ni/Ag/Pt/Ti/Pt stack structure, but is not limited thereto.

The second electrode layer 115 may be formed in the second opening 109OP2 of the first insulating pattern layer 109. The second electrode layer 115 may include a single metal film including one selected from the group consisting of Ag, Al, Ni, Au, Ti, Cr, Pd, Cu, Pt, Sn, W, Rh, Ir, Ru, Mg, Si, and Zn or a multilayered structure or alloy film including a combination thereof. In some example embodiments, the second electrode layer 115 may have an Al/Ti/Pt stack structure.

A second insulating pattern layer 117 may be further formed on the first electrode layer 113 and the second electrode layer 115. The second insulating pattern layer 117 may include openings located on portions of the first and second electrode layers 115.

A first isolated electrode layer 119A may be formed in the openings included in the second insulating pattern layer 117 and on the second insulating pattern layer 117. Also, a second isolated electrode layer 119B may be formed in the openings included in the second insulating pattern layer 117 and on the second insulating pattern layer 117. Each of the first and second isolated electrode layers 119A and 119B may include a single film including a single material selected from the group consisting of gold (Au), tin (Sn), nickel (Ni), lead (Pb), silver (Ag), indium (In), chromium (Cr), germanium (Ge), silicon (Si), titanium (Ti), tungsten (W), and platinum (Pt) or an alloy including at least two materials thereof, or a multilayered structure including a combination thereof.

Each of the first and second isolated electrode layers 119A and 119B may function as an external terminal of the semiconductor light-emitting device 100, but the inventive concepts are not limited thereto. Additional electrode pads may be further provided on the first and second isolated electrode layers, which will be described below with reference to FIG. 13.

Figure 2A:
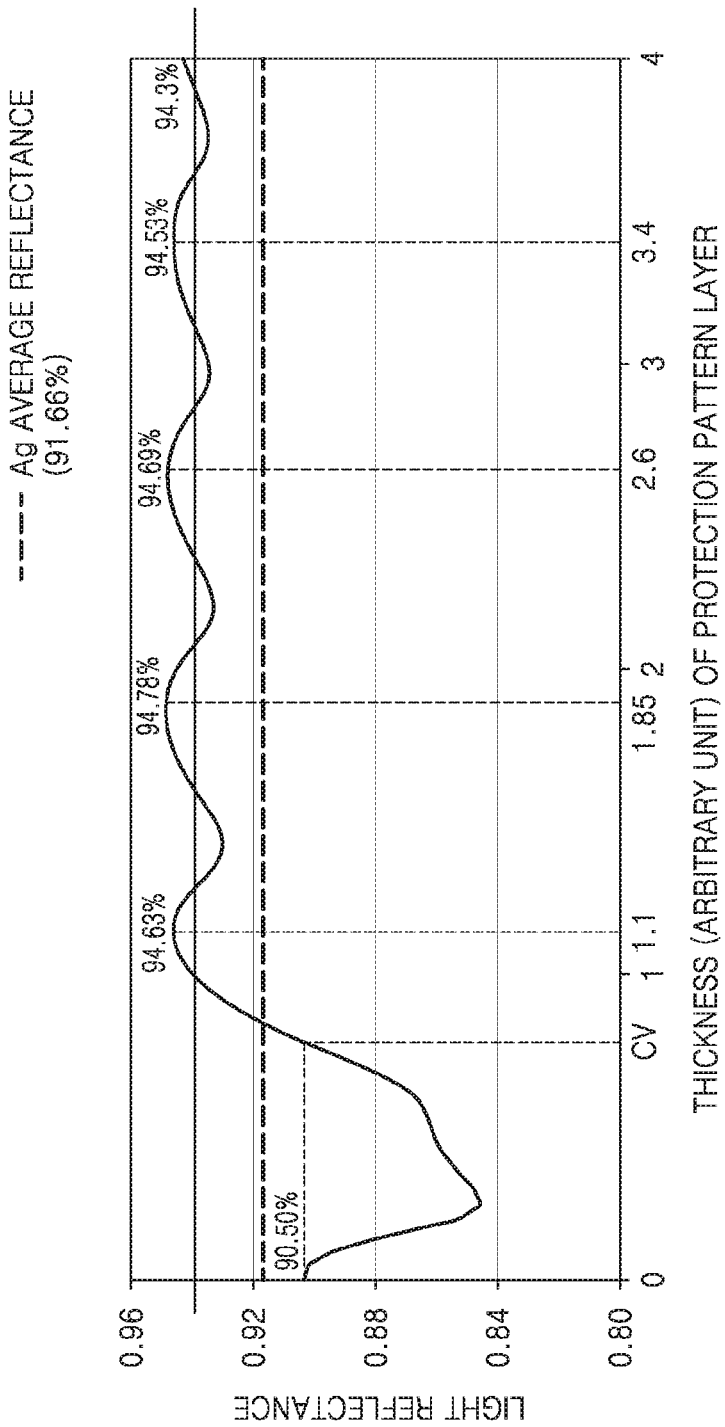
FIG. 2A is a graph of a light reflectance with respect to the thickness of a protection pattern layer according to some example embodiments.

FIG. 2A is a graph of a light reflectance with respect to the thickness of a protection pattern layer. FIG. 2A shows experimental results obtained based on the semiconductor light-emitting device 100 of FIGS. 1A to 1C.

Referring to FIGS. 1C and 2A, a semiconductor light-emitting device devoid of the protection pattern layer 105 has a light reflectance of about 90.50%. Also, a silver (Ag) metal layer that is known as having a high reflectance has a light reflectance of about 91.66%. In contrast, a semiconductor light-emitting device including the protection pattern layer 105 having a thickness 105H equal to or greater than a threshold value according to some example embodiments exhibits a light reflectance of about 90% or more on the average. The threshold value may be a thickness value that is equal to or substantially equal to (e.g., equal within manufacturing tolerances and/or material tolerances) a wavelength of light that the protection pattern layer 105 is configured to transmit therethrough.

For example, if and/or when the thickness 105H of the protection pattern layer 105 is equal to or more than a threshold value (e.g., a value that is equal or substantially equal to the wavelength of light that may be transmitted through the protection pattern layer 105), the semiconductor light-emitting device may have a higher light reflectance than when the protection pattern layer 105 is absent. Thus, the protection pattern layer 105 and the emission structure 103 may associated according to a relationship shown in Equation (1), $$H \geq \frac{\lambda}{2n}, \quad (1)$$

wherein H denotes a thickness of a protection pattern layer 105, λ denotes a wavelength of light generated by an emission structure 103, and n denotes a refractive index of the protection pattern layer 105. That is, λ denotes the wavelength of light generated by the emission structure 103, and $$\frac{\lambda}{2n}$$

denotes a half of a wavelength of light transmitted through the protection pattern layer 105. Thus, the protection pattern layer 105 may have a thickness 105H that is inversely proportional to a refractive index of the protection pattern layer 105 and is directly proportional to a wavelength of light configured to be generated by the emission structure 103.

In some example embodiments, if and/or when the thickness 105H of the protection pattern layer 105 is in a relationship shown in Equation (2), the maximum light reflectance may be periodically obtained within a numerical range, which is higher than a light reflectance of about 90.50% that is obtained when the semiconductor light-emitting device is devoid of the protection pattern layer 105.

$$H = \left(N + \frac{1}{2}\right) * \frac{\lambda}{2n}, \quad (2)$$

wherein H denotes a thickness of a protection pattern layer 105, λ denotes a wavelength of light generated by an emission structure 103, n denotes a refractive index the protection pattern layer 105, and N denotes a positive integer. From Equation (2), the protection pattern layer 105 has high light reflectances of about 94.63%, about 94.78%, and about 94.69% when N is 1, 2, and 3, respectively. Thus, the protection pattern layer 105 may have a thickness 105H that is inversely proportional to a refractive index of the protection pattern layer 105, directly proportional to a wavelength of light configured to be generated by the emission structure 103, and directly proportional to a value that is the sum of 0.5 and a positive integer.

Thus, by controlling the thickness 105H of the protection pattern layer 105, an efficient high-reflection region may be formed in the entire region (i.e., the first and second regions R1 and R2) of the emission structure 103, and light extraction efficiency of the semiconductor light-emitting device 100 may be enhanced.

In some example embodiments, the protection pattern layer 105 is not limited to the thickness range and may protect the second semiconductor layer 103C and reduce and/or prevent a rise in operating voltage in the semiconductor light-emitting device 100.

Figures 2B, 3A:
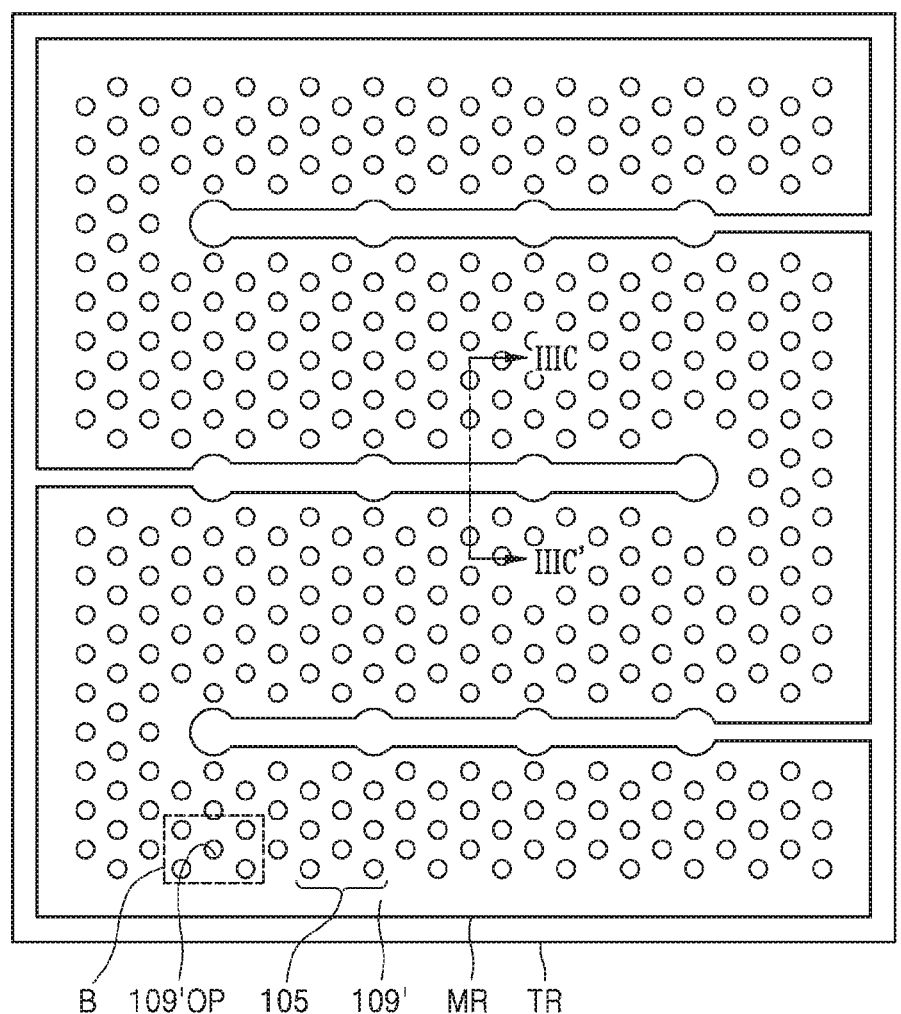
FIG. 2B shows optical efficiency relative to the diameter of a protection pattern included in a protection pattern layer and a pitch of protection patterns according to some example embodiments.
FIG. 3A is a plan view of a semiconductor light-emitting device according to some example embodiments.

FIG. 2B shows optical efficiency relative to the diameter of a protection pattern included in a protection pattern layer 105 and a pitch P of protection patterns included in the protection pattern layer 105. FIG. 2B shows experimental results obtained based on the semiconductor light-emitting device 100 of FIGS. 1A to 1C. In FIG. 2B, the optical efficiency indicates luminous flux relative to power consumption.

Referring to FIGS. 1C and 2B, D1, D2, and D3 denote the diameter 105R of the protection pattern 105P and have gradually reduced numerical values. P1, P2, and P3 denote pitches P between the protection patterns 105P and have gradually increased numerical values. As the diameter 105R of the protection pattern 105P decreases, the optical efficiency of the protection pattern layer 105 may increase. In particular, when the protection patterns 105P are formed in a dense arrangement by reducing both the diameter 105R of the protection patterns 105P and the pitch P between the protection patterns 105P, the semiconductor light-emitting device 100 may have an optimized optical efficiency.

Figure 3B:
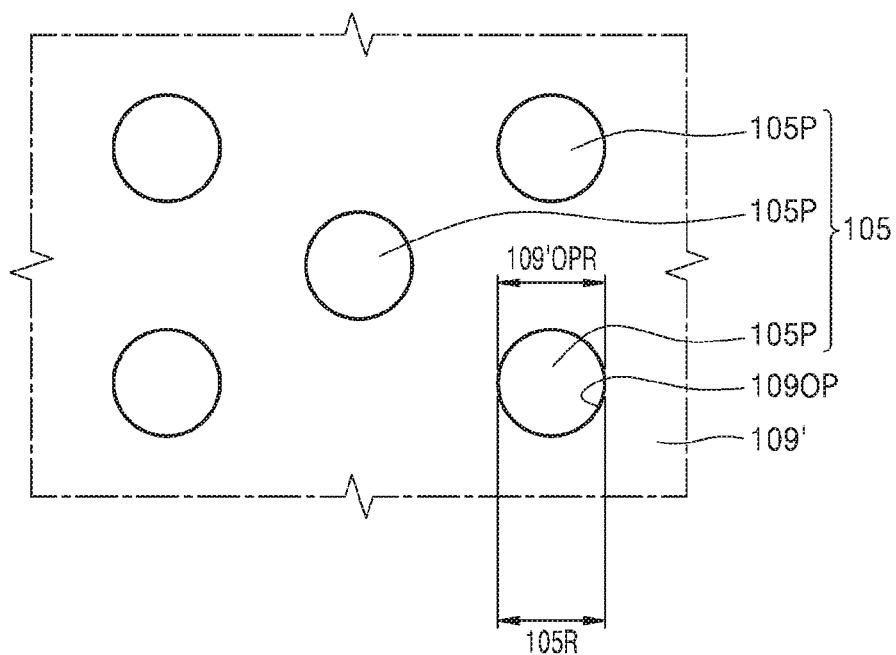
FIG. 3B is an enlarged view of a portion B of FIG. 3A.

FIG. 3A is a plan view of a semiconductor light-emitting device 100' according to some example embodiments. FIG. 3B is an enlarged view of a portion B of FIG. 3A. FIG. 3C is a cross-sectional view taken along a line IIIC-IIIC' of FIG. 3A. The semiconductor light-emitting device 100' may be similar to the semiconductor light-emitting device 100 of FIGS. 1A to 1C except that a diameter of a first opening 109'OP is equal to a diameter of a protection pattern layer 105. The same reference numerals are used to denote the same elements, and repeated descriptions thereof are omitted.

Referring to FIGS. 3A to 3C, a diameter 105R of a protection pattern 105P included in a protection pattern layer 105 may be equal or substantially equal (e.g., equal within manufacturing tolerances and/or material tolerances) to a diameter 109'OPR of a first opening 109'OP of a first insulating pattern layer 109'. That is, when a bottom surface of the protection pattern 105P faces (e.g., is proximate and/or adjacent to) a top surface of the emission structure and a bottom of the first opening 109'OP faces (e.g., is proximate and/or adjacent to) a top surface of the protection pattern, an area of the bottom surface of the protection pattern may be equal or substantially equal to a sectional area of the bottom of the first opening 109'OP. In some example embodiments, a boundary of an inner wall of the first opening 109'OP may be substantially the same as (e.g., substantially common with, common within manufacturing tolerances and/or material tolerances, etc.) a boundary of the side surface of the protection pattern layer 105 in a direction perpendicular or substantially perpendicular (e.g., perpendicular within manufacturing tolerances and/or material tolerances) to the top surface of the emission structure 103.

The first insulating pattern layer 109' may cover the top surface of the emission structure 103 and a side surface of the protection pattern layer 105 and may not cover a top surface of the protection pattern layer 105. However, the first insulating pattern layer 109' may cover a partial top surface of a current diffusion layer 107 formed on a sidewall of the protection pattern layer 105.

In some example embodiments, the protection pattern layer 105 may cover the entire top surface of a second semiconductor layer 103C on which the first opening 109'OP is located. Thus, the top surface of the second semiconductor layer 103C may be protected by the protection pattern layer 105. Accordingly, a rise in operating voltage of the semiconductor light-emitting device 100' caused by damage to the second semiconductor layer 103C may be reduced and/or prevented.

In addition, when the protection pattern layer 105 is formed of an insulating material, the entire region of the emission structure 103 may be embodied as a high-reflection region, thereby increasing light extraction efficiency.

Figure 4A:
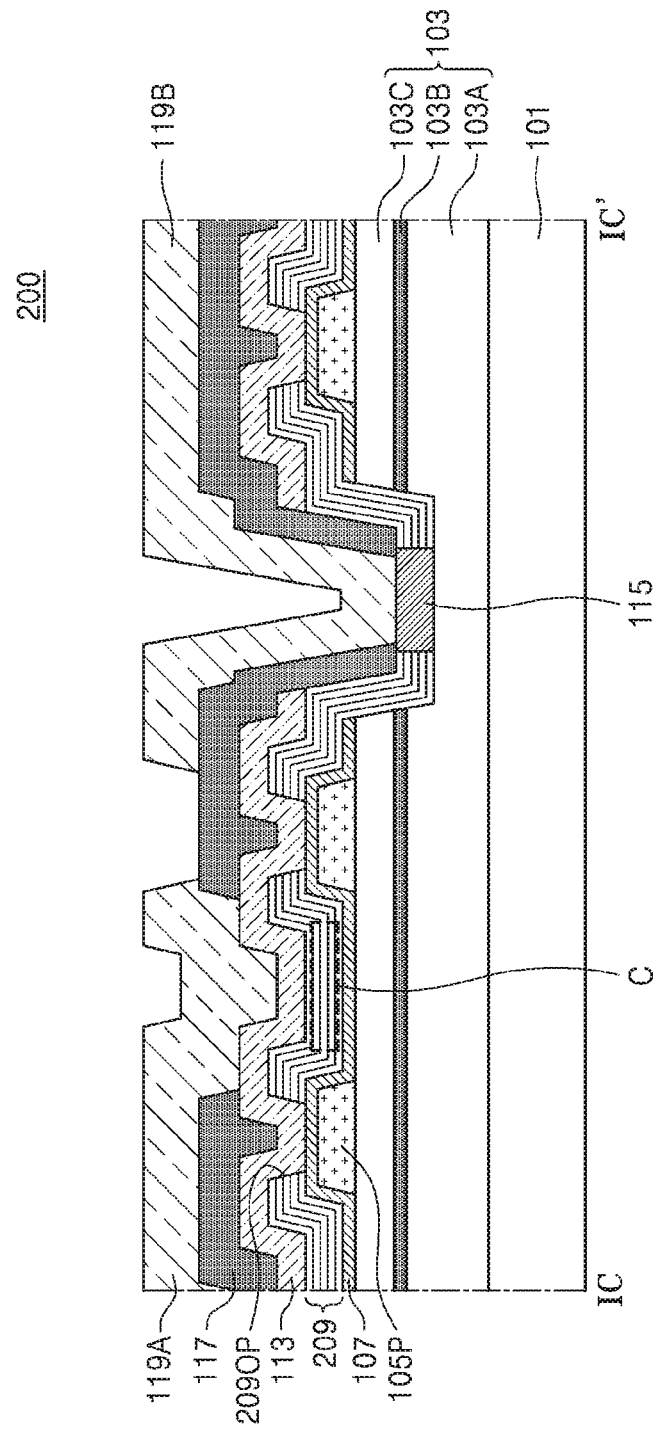
FIG. 4A is a cross-sectional view taken along line IC-IC' of FIG. 1A, illustrating a structure of the semiconductor light-emitting device according to some example embodiments.
Figure 4B:
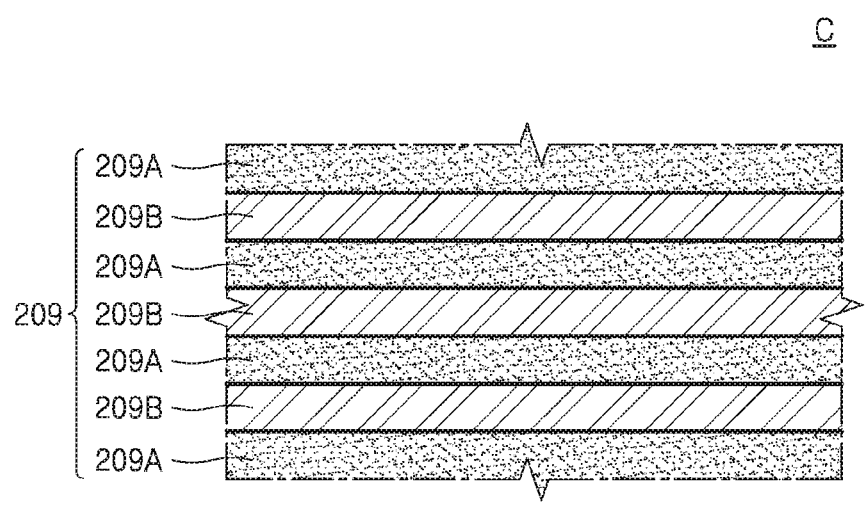
FIG. 4B is an enlarged cross-sectional view of a portion C of FIG. 4A.

FIG. 4A is a cross-sectional view of a semiconductor light-emitting device 200 according to some example embodiments. FIG. 4A shows an exemplary sectional structure corresponding to the line IC-IC' of FIG. 1A. FIG. 4B is an enlarged cross-sectional view of a portion C of FIG. 4A. The semiconductor light-emitting device 200 of FIG. 4A is similar to the semiconductor light-emitting device 100 of FIGS. 1A and 1B except that a first insulating pattern layer 209 has a DBR structure.

Referring to FIGS. 4A and 4B, the semiconductor light-emitting device 200 may include an emission structure 103 formed on a substrate 101, a protection pattern layer 105 formed on a partial region of the emission structure 103, and a first insulating pattern layer 209 having an opening 209OP located on a portion of the protection pattern layer 105. In some example embodiments, the first insulating pattern layer 209 may include a DBR structure having a high reflectance.

Specifically, the first insulating pattern layer 209 may have a lower refractive index than a refractive index of the second semiconductor layer 103C and may have a structure including a stack of alternating layers of a first layer 209A and a second layer 209B, where the first and second layers 209A and 209B have different refractive indices. Thus, the first insulating pattern layer 209 may include a stack of layers, where adjacent layers of the stack of layers associated with different refractive indices, and each layer of the stack of layer being associated with a refractive index that is lower than the refractive index associated with the second semiconductor layer, respectively. A thickness and/or material of each of the first layer 209A and second layer 209B and the number of instances of the first layer 209A and the second layer 209B may be selected and designed such that the combined structure of the first layer 209A and the second layer 209B has a high reflectance with respect to the wavelength of light generated by the emission structure 103. The first layer 209A and the second layer 209B may integrally cover a top surface of the emission structure 103, a side surface of the protection pattern layer 105, and at least a portion of a top surface of the protection pattern layer 105. The first layer 209A and the second layer 209B may integrally cover a limited portion of the top surface of the protection pattern layer. The first insulating pattern layer 209 is not limited to the configuration shown in FIG. 4A but may include one of various DBR structures.

FIGS. 4A and 4B show an example in which the first and second layers 209A and 209B are alternately stacked, but the inventive concepts are not limited thereto. In some example embodiments, the first insulating pattern layer 209 may include one of various multilayered structures in which at least three layers are arbitrarily stacked or alternately stacked.

As described above, a region in which the second semiconductor layer 103C is in contact with the first insulating pattern layer 209 and a region in which the second semiconductor layer 103C is in contact with the protection pattern layer 105 including an insulating material may be embodied as high-reflection regions due to differences in refractive index over the entire region of the emission structure 103. In some example embodiments, the first insulating pattern layer 209 has a DBR structure so that a reflectance of light generated by the emission structure 103 may be markedly improved.

Figure 5A:
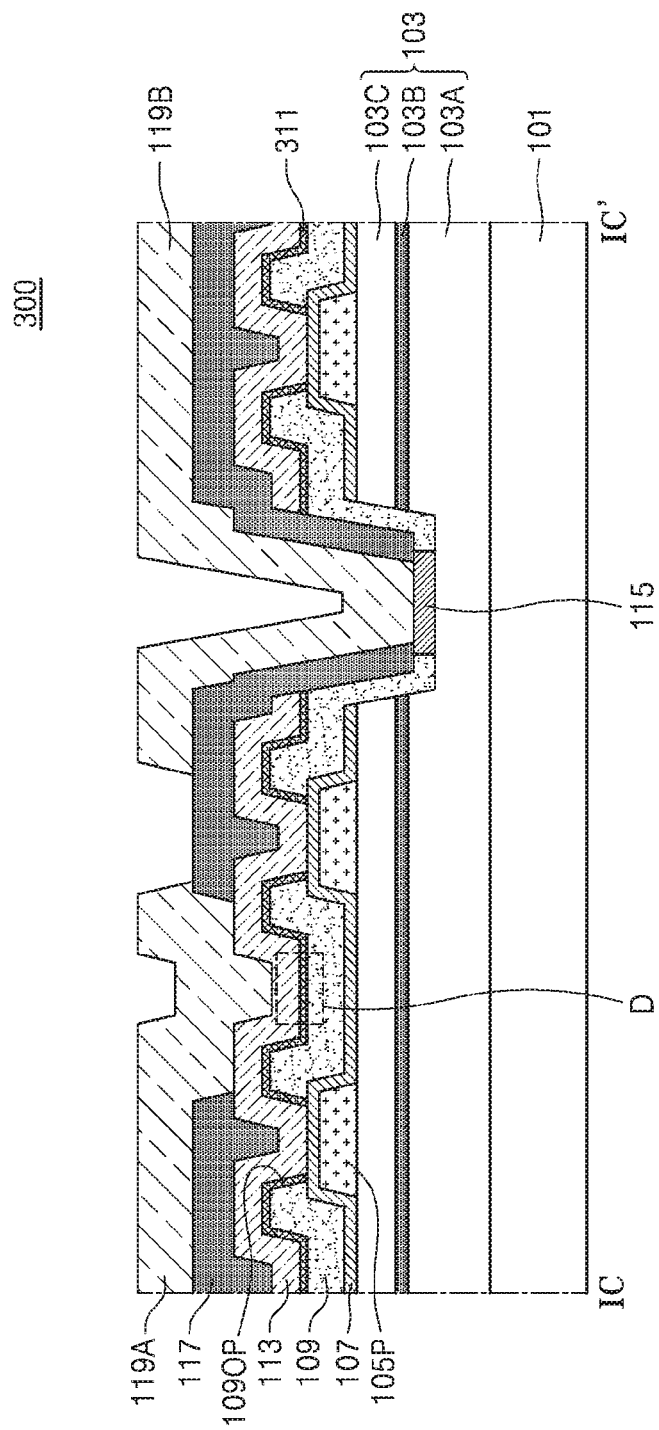
FIG. 5A is a cross-sectional view taken along the line IC-IC' of FIG. 1A, illustrating a structure of the semiconductor light-emitting device according to some example embodiments.
Figure 5B:
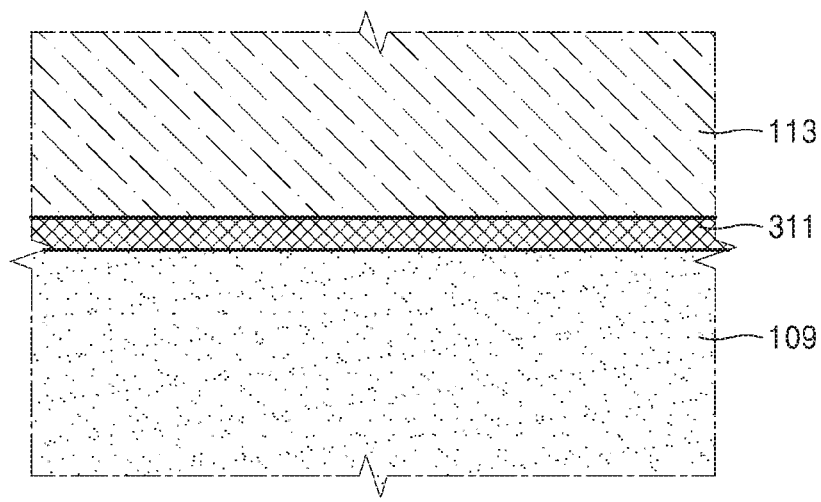
FIG. 5B and FIG. 5C are enlarged cross-sectional views of example structures of a portion D of FIG. 5A.
Figure 5C:
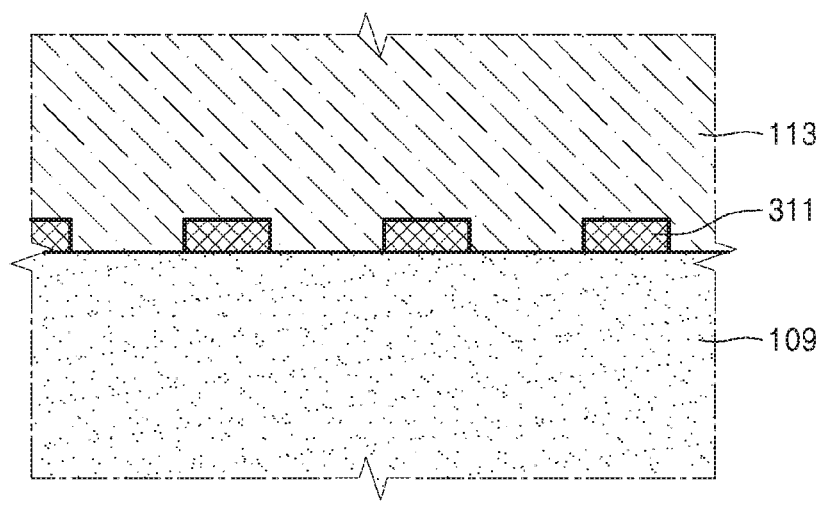

FIG. 5A is a cross-sectional view of a semiconductor light-emitting device 300 according to some example embodiments. FIG. 5A shows an exemplary sectional structure corresponding to the line IC-IC' of FIG. 1A. FIGS. 5B and 5C are enlarged cross-sectional views of example structures of a portion D of FIG. 5A. The semiconductor light-emitting device 300 of FIG. 5A may be similar to the semiconductor light-emitting device 100 of FIGS. 1A and 1B except that an adhesive layer 311 is further interposed between a first insulating pattern layer 109 and a first electrode layer 113.

Referring to FIGS. 5A and 5B, the semiconductor light-emitting device 300 may include an emission structure 103 formed on a substrate 101, a protection pattern layer 105 formed on the emission structure 103, a current diffusion layer 107 covering the emission structure 103 and the protection pattern layer 105, a first insulating pattern layer 209 including an opening 109OP, an adhesive layer 311 covering an inner side of the opening 109OP and a top surface of the first insulating pattern layer 109, and a first electrode layer 113 formed on the adhesive layer 311.

Specifically, the adhesive layer 311 may cover an inner side of the opening 109OP, and the top surface of the first insulating pattern layer 109. In some example embodiments, the adhesive layer 311 may have a thin film structure having a constant structure as shown in FIG. 5B or a structure including a plurality of island-shaped patterns spaced apart from one another as shown in FIG. 5C. In some example embodiments, the adhesive layer 311 may be formed by performing a plasma processing process ("plasma operation") whereby a plasma is utilized until the adhesive layer 311 reaches a thickness of about 20 Å while tin oxide ($SnO_2$) and indium oxide ($In_2O_3$) are being supplied to a reaction chamber. In some example embodiments, the adhesive layer 311 may be deposited by performing a plasma operation for about 15 seconds to about 25 seconds while tin oxide ($SnO_2$) and indium oxide ($In_2O_3$) are being supplied to a reaction chamber.

In general, when the first electrode layer 113 is formed on the first insulating pattern layer 109 including an insulating material, the first electrode layer 113 may be delaminated from the first insulating pattern layer 109 due to a weak adhesion of the first electrode layer 113 with the first insulating pattern layer 109. When the delamination of the first electrode layer 113 worsens, electrical coupling of the first electrode layer 113 with the emission structure 103 may become unstable, and an operating voltage of the semiconductor light-emitting device 300 may rise.

In contrast, when the adhesive layer 311 including a material (e.g., ITO) is formed on the first insulating pattern layer 109, the first electrode layer 113 may be reduced and/or prevented from being delaminated from the first insulating pattern layer 109 due to the adhesive layer 311. Thus, the first electrode layer 113 may be stably coupled to the adhesive layer 311, the current diffusion layer 107, and the emission structure 103 so that a rise in operating voltage may be reduced and/or prevented and reliability of the semiconductor light-emitting device 300 may be ensured.

Figure 7:
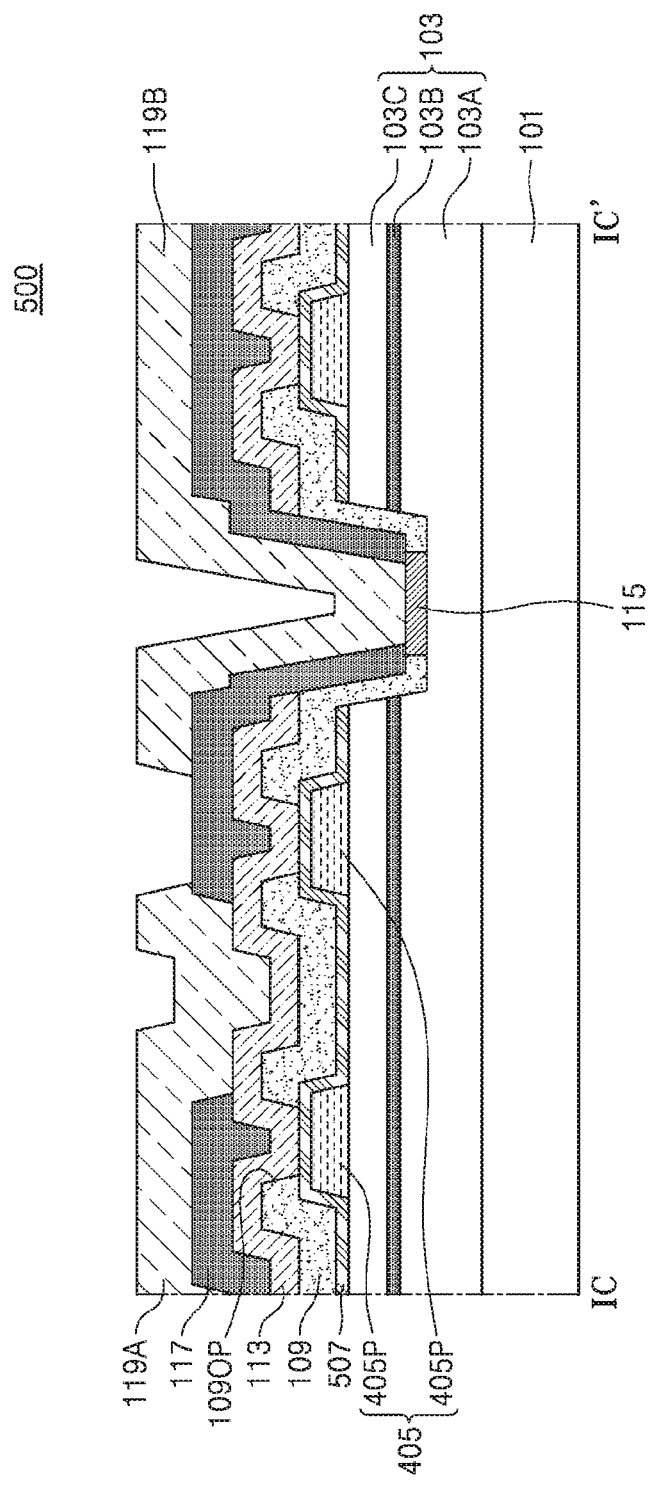
FIG. 7 is a cross-sectional view taken along the line IC-IC' of FIG. 1A, illustrating a structure of the semiconductor light-emitting device according to some example embodiments.

FIGS. 6 and 7 are cross-sectional views of semiconductor light-emitting devices 400 and 500 according to some example embodiments. FIGS. 6 and 7 show exemplary sectional structures corresponding to the line IC-IC' of FIG. 1A. The semiconductor light-emitting device 400 of FIG. 6 may be similar to the semiconductor light-emitting device 100 of FIGS. 1A and 1B except that a protection pattern layer 405 includes a one or more protection patterns 405P that include a metal material and a current diffusion layer is omitted. The semiconductor light-emitting device 500 of FIG. 7 may be similar to the semiconductor light-emitting device 400 of FIG. 6 except that a current diffusion layer 507 is further provided.

Referring to FIG. 6, the semiconductor light-emitting device 400 may include an emission structure 103 formed on a substrate 101, a protection pattern layer 105 having a conductivity formed on the emission structure 103, a first insulating pattern layer 109 including an opening 109OP, and a first electrode layer 113 formed on the protection pattern layer 105 and the first insulating pattern layer 109.

As described above, the protection pattern layer 105 may be formed on a partial region of the second semiconductor layer 103C of the emission structure 103. The protection pattern layer 105 may cover the entire top surface of the emission structure 103 on which the opening 109OP is located.

The protection pattern layer 105 may include a conductive material having a high reflectance in a wavelength range of light generated by the emission structure 103. Thus, the protection pattern layer 105 may include a metal material, for example, silver (Ag), aluminum (Al), chromium (Cr), a combination thereof, or an alloy thereof. Since the protection pattern layer 105 is capable of directly transmitting current, which is supplied through the first electrode layer 113, to the emission structure 103, the current diffusion layer 107 of FIG. 1C may be omitted.

The protection pattern layer 105 may be formed by using an e-beam evaporation process.

Referring to FIG. 7, the semiconductor light-emitting device 500 of FIG. 7 may be similar to the semiconductor light-emitting device 400 of FIG. 6 except that the current diffusion layer 507 is further provided to integrally cover a top surface of a second semiconductor layer 103C of an emission structure 103 and a top surface of and a side surface a protection pattern layer 405 including a conductive material. The current diffusion layer 507 may diffuse current, which is supplied from the first electrode layer 113, in a direction parallel to the top surface of the emission structure 103. Thus, the crowding of current into a specific region of the emission structure 103 may be inhibited to increase light extraction efficiency.

FIGS. 8A to 12A are plan views of process operations of a method of manufacturing a semiconductor light-emitting device according to some example embodiments. FIGS. 8B to 11B are enlarged views of portions B of FIGS. 8A to 11A, respectively. FIGS. 8C to 11C and 12B are cross-sectional views corresponding to the lines IC-IC' of FIGS. 8A to 12A, respectively.

Figure 8A:
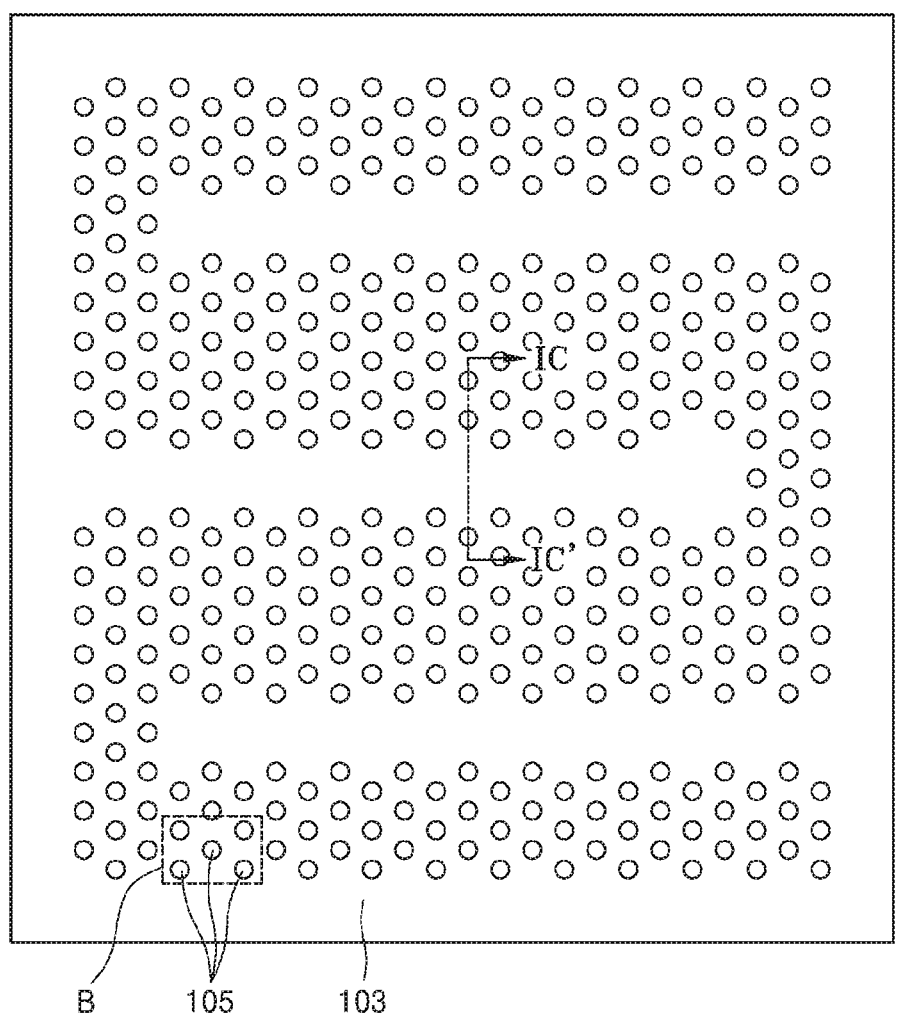
FIG. 8A, FIG. 9A, FIG. 10A, FIG. 11A, and FIG. 12A are plan views of process operations of a method of manufacturing a semiconductor light-emitting device according to some example embodiments.
Figure 8B:
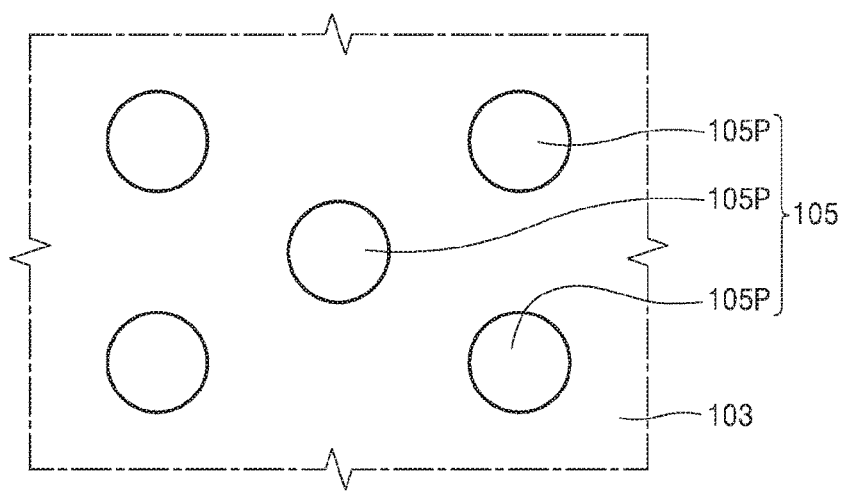
FIG. 8B, FIG. 9B, FIG. 10B, and FIG. 11B are enlarged views of portions B of FIG. 8A, FIG. 9A, FIG. 10A, and FIG. 11A, respectively.
Figure 8C:
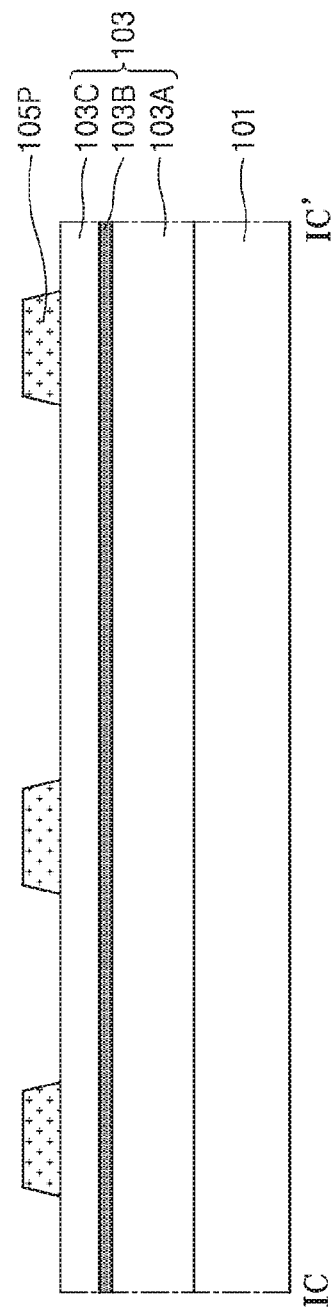

Referring to FIGS. 8A to 8C, a first semiconductor layer 103A, an active layer 103B, and a second semiconductor layer 103C may be sequentially stacked on a substrate 101 to form an emission structure 103. In some example embodiments, the emission structure 103 may be formed by using a MOCVD process, an HVPE process, or an MBE process.

Thereafter, a preliminary protection layer may be formed on the emission structure 103. The preliminary protection layer may include an insulating material. In some example embodiments, the preliminary protection layer may be formed by using a plasma-enhanced chemical vapor deposition (PECVD) process, a physical vapor deposition (PVD) process, or a CVD process, but the inventive concepts are not limited thereto. Subsequently, the preliminary protection layer may be partially etched by using a patterning process so that a protection pattern layer 105 may be formed on the emission structure 103.

In some example embodiments, the protection pattern layer 105 may include a conductive material, for example, a metal material, and may be formed according to an e-beam evaporation process. When the protection pattern layer 105 includes a metal material, a mask pattern layer for a lift-off process may be formed on the emission structure 103, a metal material may be deposited, and the mask pattern layer may be removed to form the protection pattern layer 105 including the metal material.

Figure 9A:
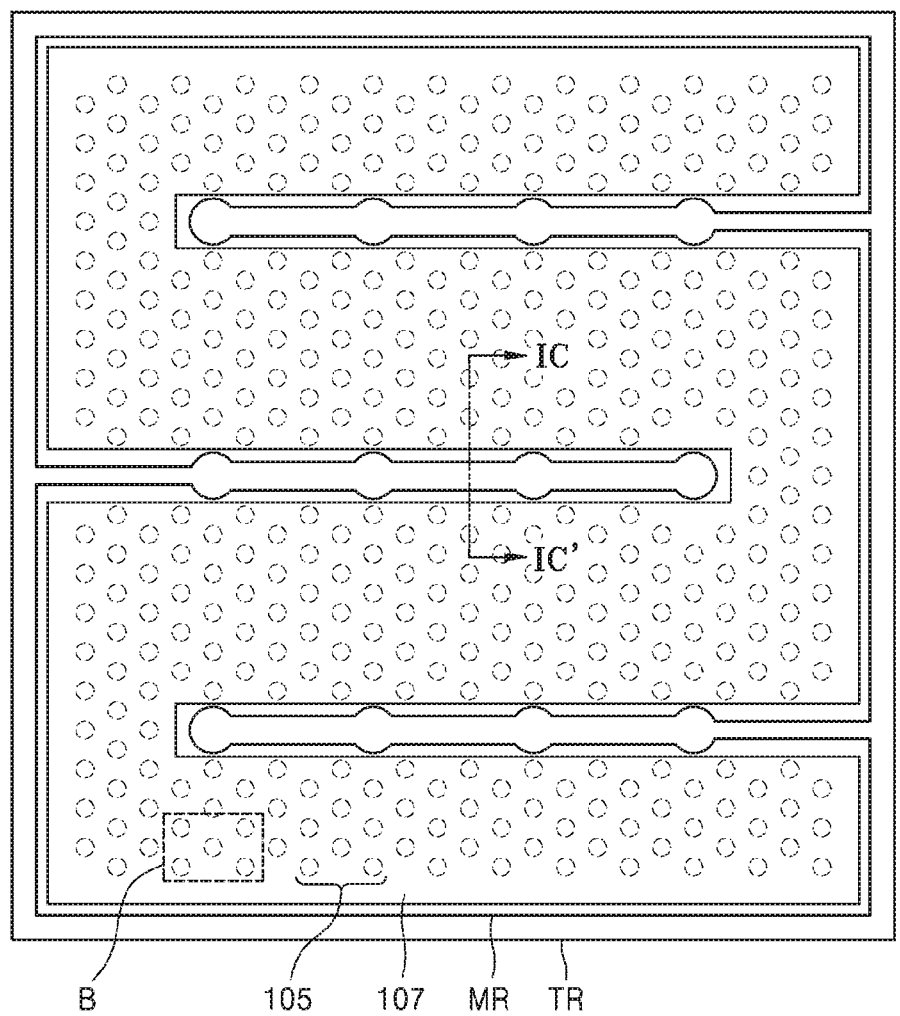
Figure 9B:
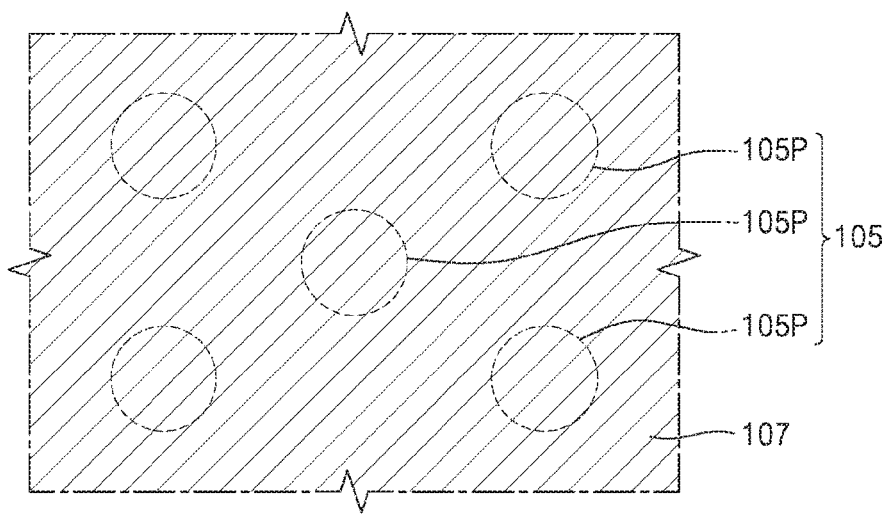
Figure 9C:
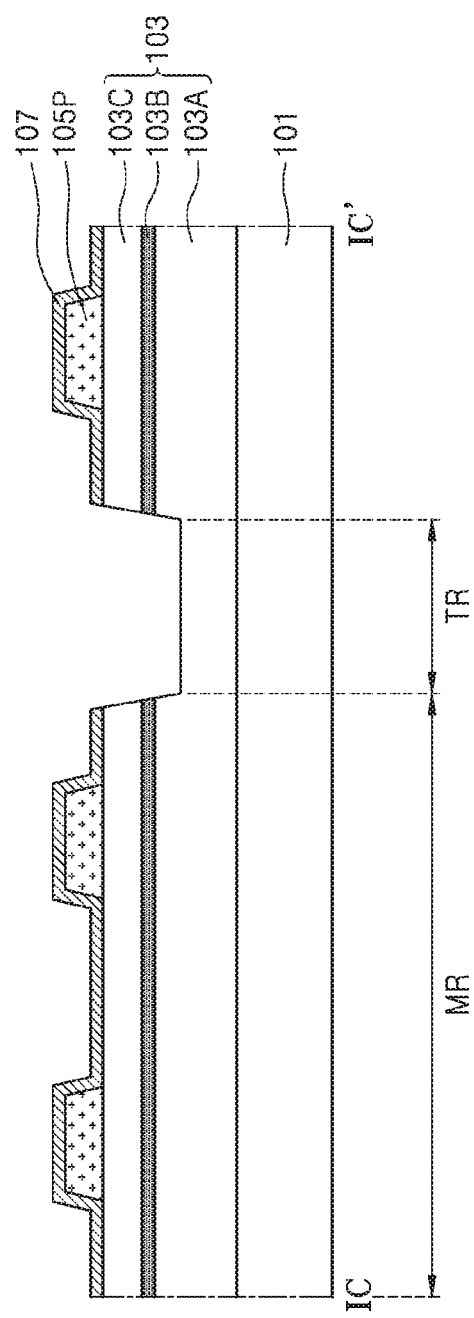

Referring to FIGS. 9A to 9C, a current diffusion layer 107 may be deposited on the entire surface of the emission structure 103 on which the protection pattern layer 105 is formed. However, when the protection pattern layer 105 includes a conductive material, for example, a metal material, the process of forming the current diffusion layer 107 may be omitted.

Thereafter, a mesa etching process may be performed on the emission structure 103 on which the current diffusion layer 107 is formed. Specifically, the emission structure 103 may be partially etched from the second semiconductor layer 103C to a partial depth of the first semiconductor layer 103A to expose a top surface of the first semiconductor layer 103A. Thus, a trench region TR and a mesa region MR may be formed. The trench region TR may expose the top surface of the first semiconductor layer 103A. The mesa region MR may be formed at a higher level than the trench region TR, and the current diffusion layer 107 formed on the second semiconductor layer 103C may form a top surface of the mesa region MR. In some example embodiments, the etching of the emission structure 103 may be performed by using a reactive ion etching (RIE) process.

However, the process operations for manufacturing the semiconductor light-emitting device are not limited to the above-described order, and the mesa etching process may be performed before the processes of forming the protection pattern layer 105 and the current diffusion layer 107.

Figure 10A:
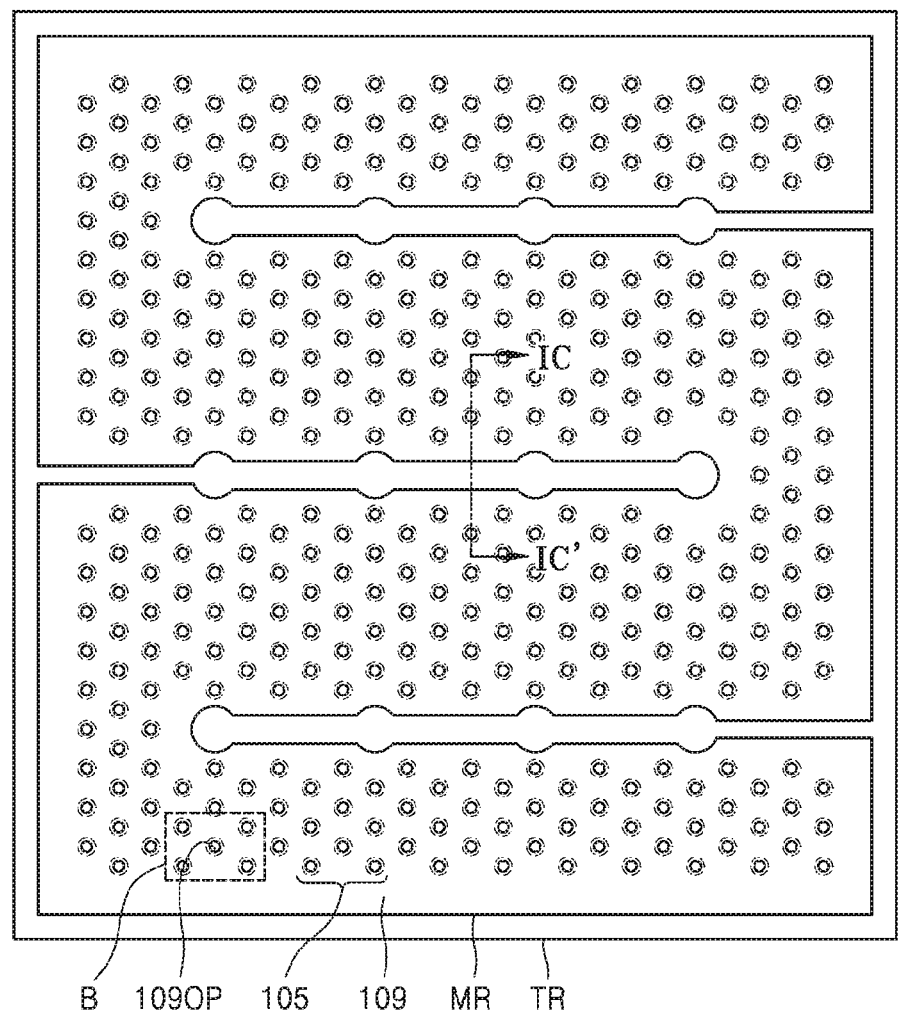
Figure 10B:
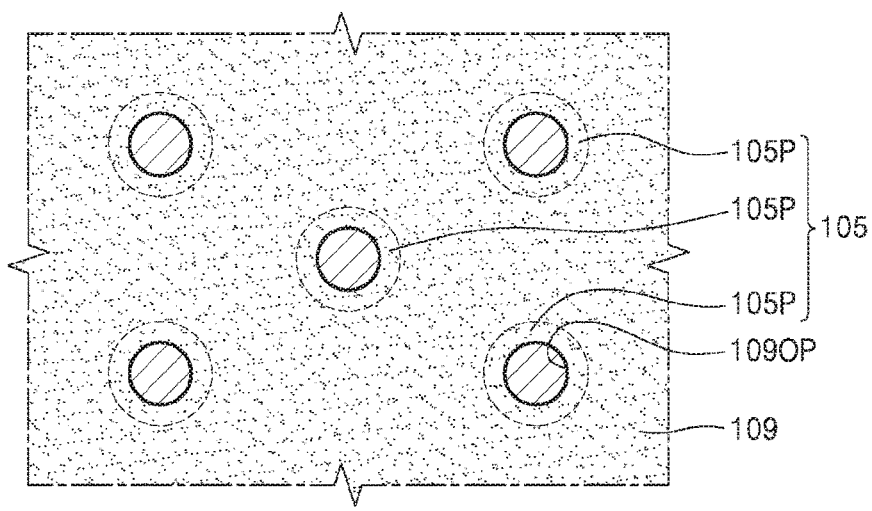
Figure 10C:
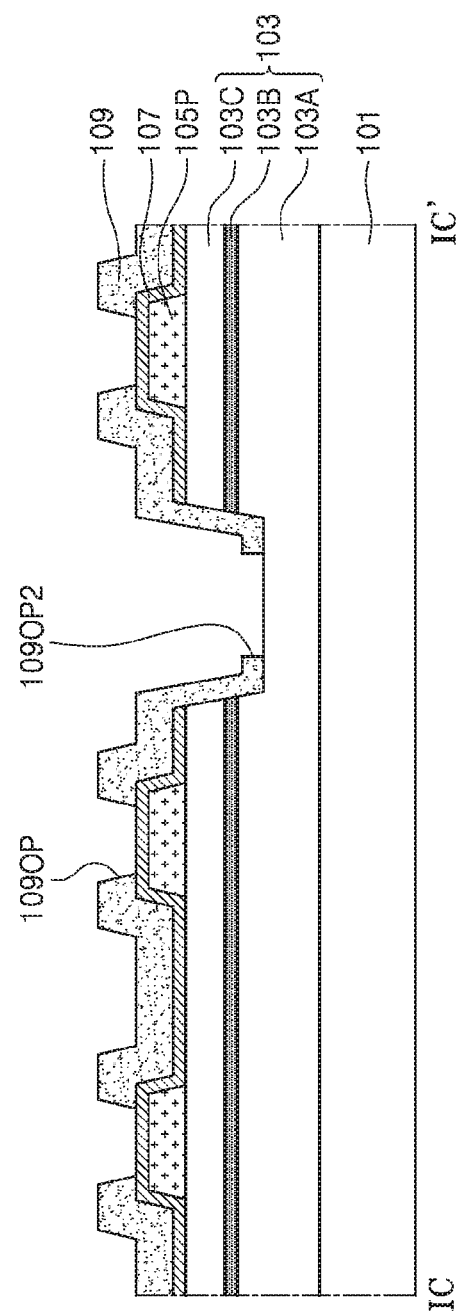

Referring to FIGS. 10A to 10C, a preliminary first insulating layer may be formed to cover the entire surface of the resultant structure of FIGS. 9A to 9C. The preliminary first insulating layer may be formed by using a PECVD process, a PVD process, a CVD process, or a spin coating process.

Thereafter, the preliminary first insulating layer may be partially etched to form a first insulating pattern layer 109 including a first opening 109OP and a second opening 109OP2. The first opening 109OP may be located on a region of a top surface of the current diffusion layer 107, which may overlap the protection pattern layer 105. The second opening 109OP2 may be located on a top surface of the first semiconductor layer 103A. In some example embodiments, the first opening 109OP may be formed only on the protection pattern layer 105. Thus, an area of a bottom of the first opening 109OP may be smaller than an area of a bottom surface of the protection pattern layer 105.

The first and second openings 109OP and 109OP2 may be formed by using an RIE process and a wet etching process using a buffered oxide etchant (BOE).

Figure 11A:
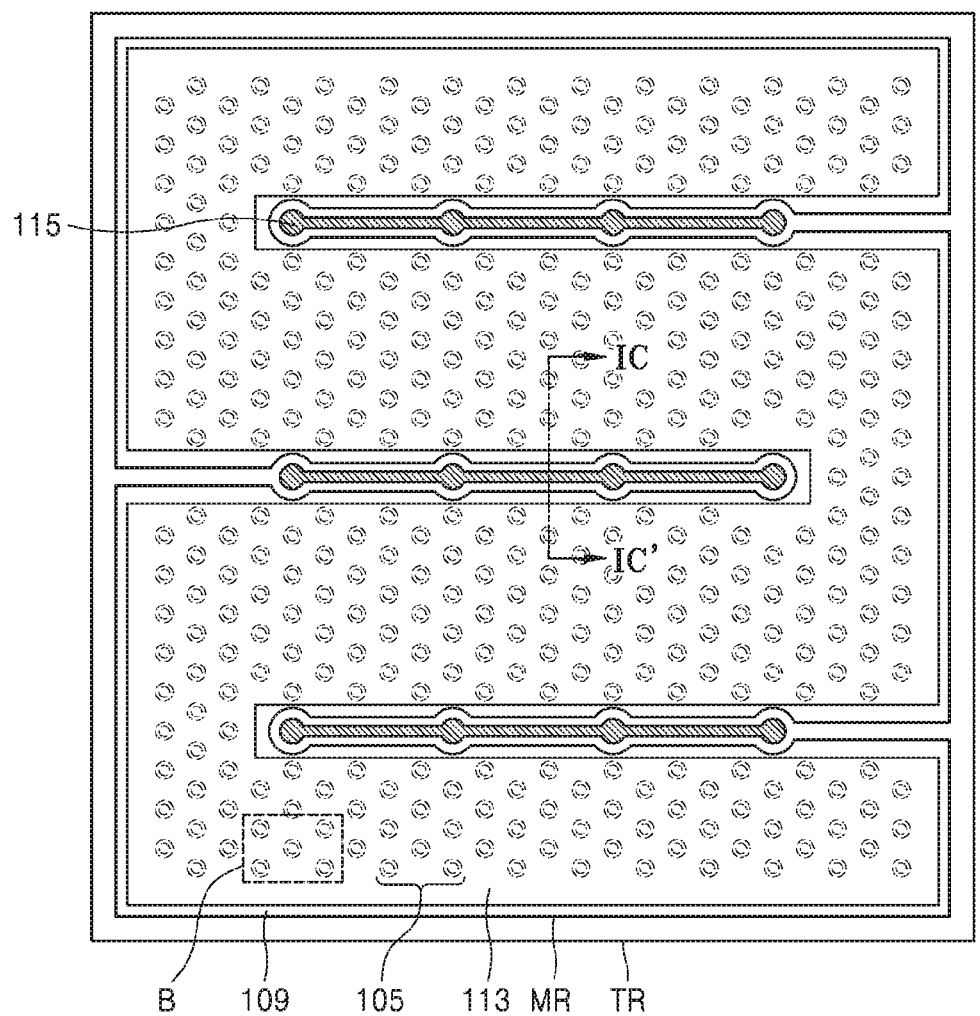
Figure 11B:
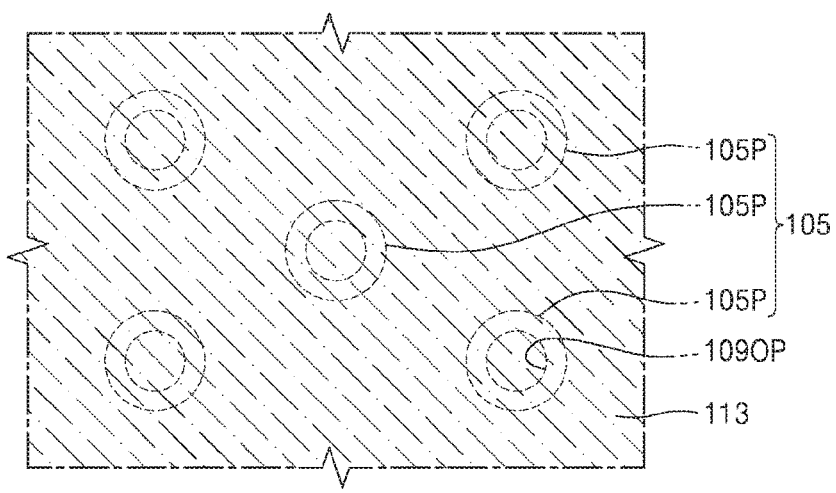
Figure 11C:
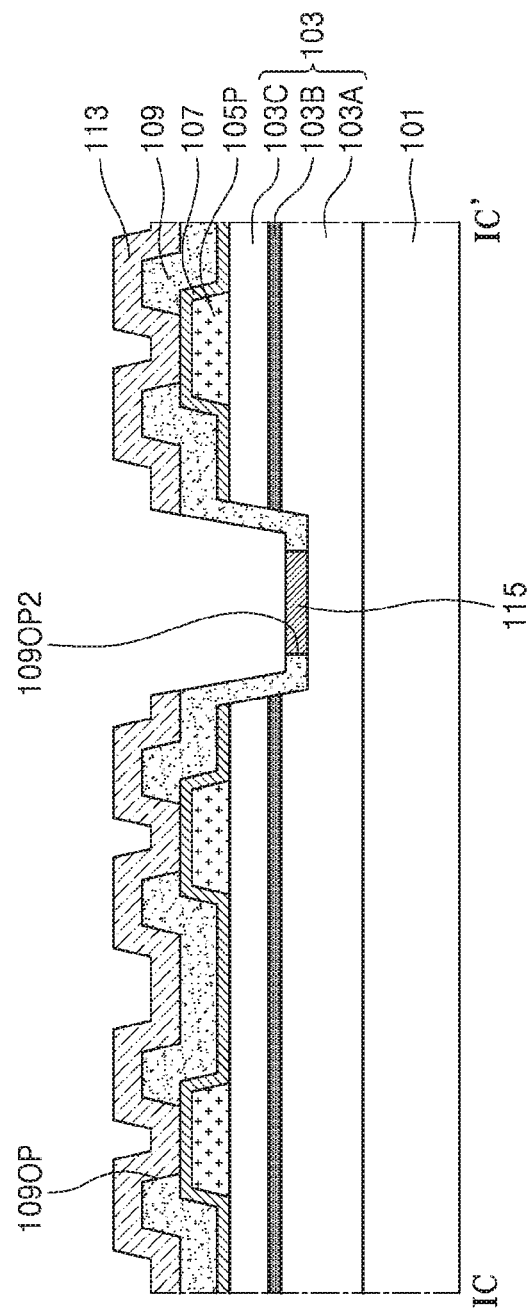

Referring to FIGS. 11A to 11C, a first electrode layer 113 may be formed to cover the current diffusion layer 107 exposed by the first opening 109OP, an inner side of the first opening 109OP, and a top surface of the first insulating pattern layer 109. Specifically, a mask pattern layer for a lift-off process may be formed on the resultant structure of FIGS. 10A to 10C, a preliminary first electrode material layer may be formed, and the mask pattern layer may be removed to form the first electrode layer 113.

The preliminary first electrode material layer may be formed by using a sputtering process or a PECVD process. However, since the sputtering process or the PECVD process uses high energy, supplied electrode materials may react with the second semiconductor layer 103C or apply physical damage to the second semiconductor layer 103C so that an operating voltage of a light-emitting device may rise.

In contrast, according to some example embodiments, the protection pattern layer 105 may be formed on a region of the top surface of the second semiconductor layer 103C on which the first opening 109OP is located. Thus, the second semiconductor layer 103C may be reduced and/or prevented from being directly exposed during the sputtering or PECVD process for forming the first electrode layer 113. Thus, a rise in operating voltage of the semiconductor light-emitting device 100 caused by damage to the second semiconductor layer 103C may be reduced and/or prevented.

After the first electrode layer 113 is formed, a second electrode layer 115 may be formed in the second opening 109OP2. The processes of forming the first and second electrode layers 113 and 115 are not limited to the above-described order.

Figure 12A:
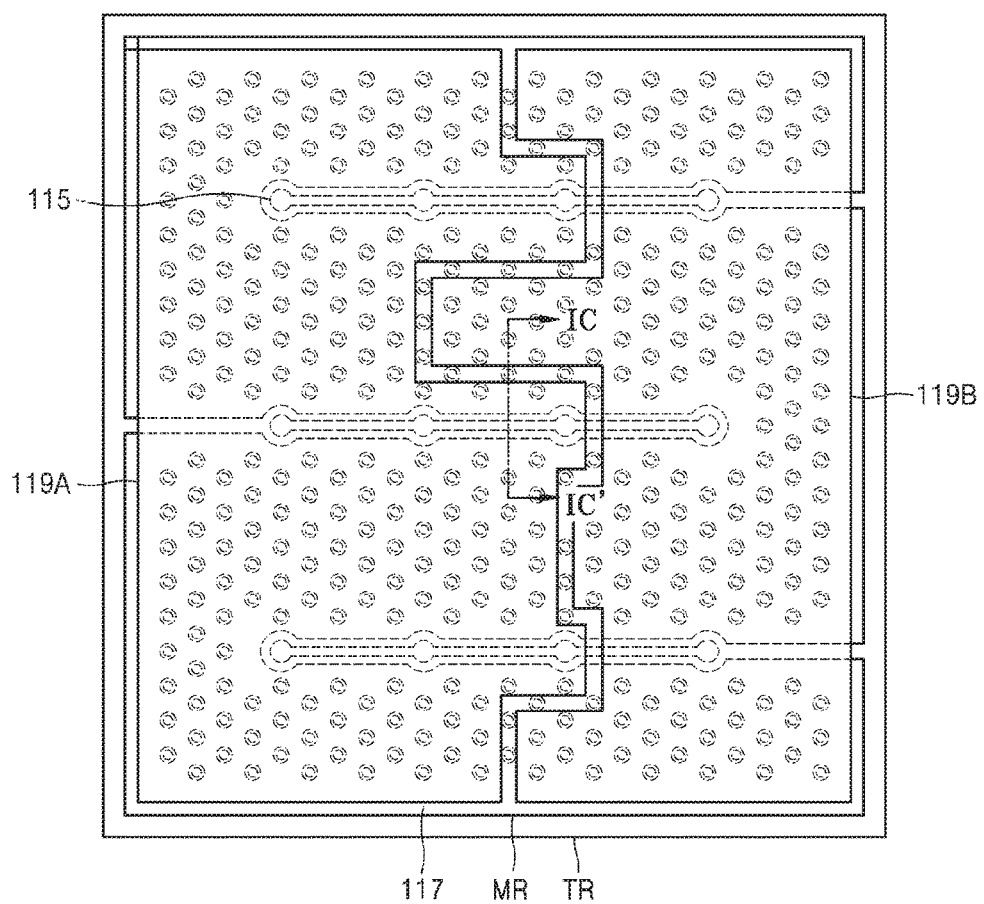

Referring to FIGS. 12A and 12B, a preliminary second insulating layer may be formed on the first and second electrode layers 113 and 115, and openings may be formed to expose partial regions of the first and second electrode layers 113 and 115, thereby forming a second insulating pattern layer 117.

Thereafter, a first isolated electrode layer 119A and a second isolated electrode layer 119B may be formed in the openings of the second insulating pattern layer 117 and coupled to the first and second electrode layers 113 and 115, respectively.

The processes described with reference to FIGS. 8A to 12B may be performed otherwise. For example, two process steps described in a sequential order may be performed substantially at the same time (e.g., the same time within manufacturing tolerances and/or material tolerances) or in reverse order.

Figure 13:
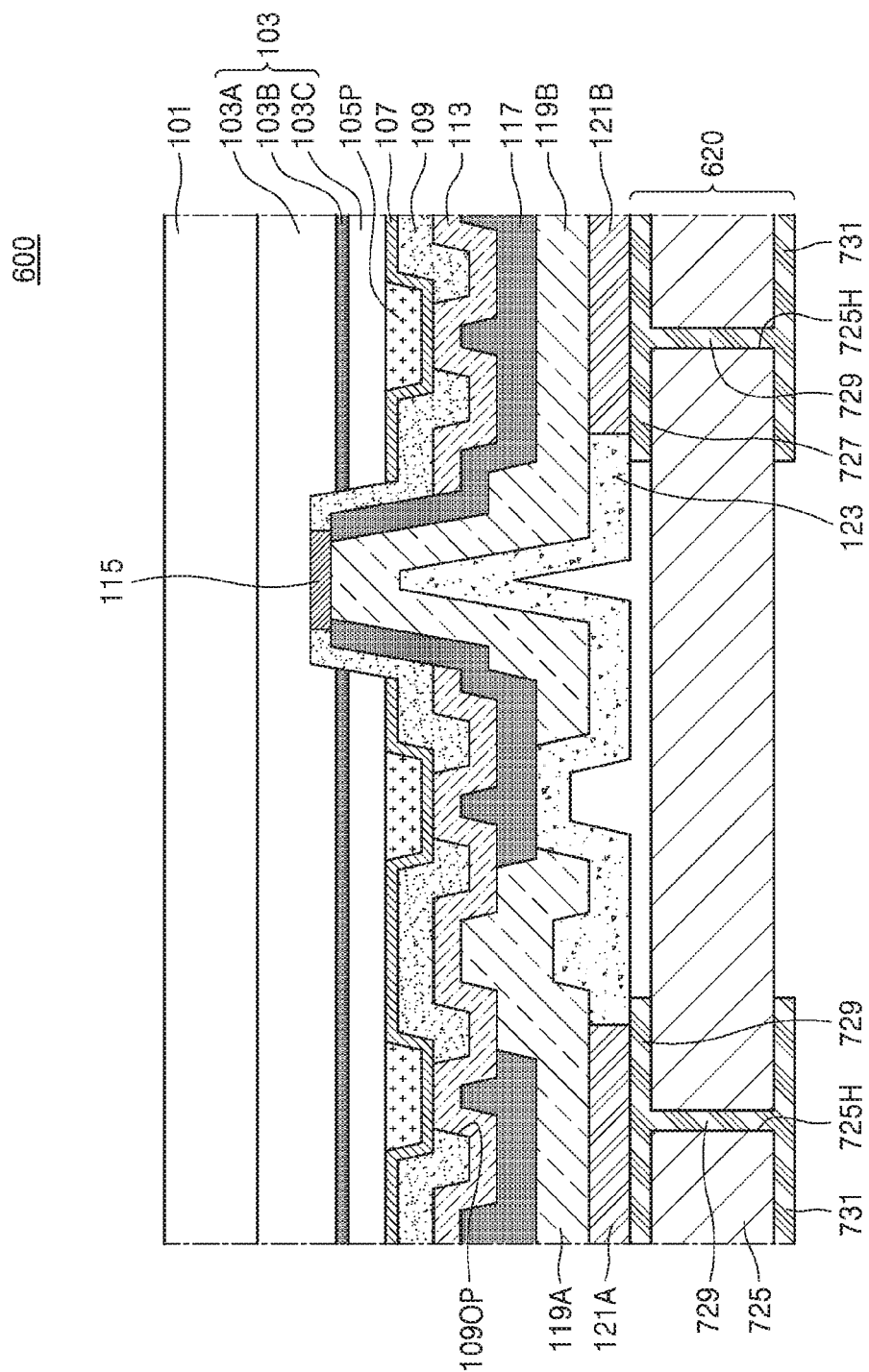
FIG. 13 is a cross-sectional view taken along the line IC-IC' of FIG. 1A, illustrating a structure of the semiconductor light-emitting device according to some example embodiments.

FIG. 13 is a cross-sectional view of a semiconductor light-emitting device 600 according to some example embodiments. FIG. 13 shows an example structure corresponding to the line IC-IC' of FIG. 1A. The semiconductor light-emitting device 600 may be a structure in which the semiconductor light-emitting device 100 described with reference to FIGS. 1A to 1C is mounted on a package substrate 620.

Referring to FIG. 13, the package substrate 620 may include a substrate main body 725 including a plurality of through holes 725H, a plurality of through-silicon vias (TSVs) 729 formed in the plurality of through holes 725H, and a plurality of conductive layers (e.g., conductive layers 727 and 731) formed on both surfaces of the substrate main body 725. The plurality of conductive layers 727 and 731 may be respectively coupled to both end portions of the TSVs 729 on the both surfaces of the substrate main body 725.

The plurality of conductive layers 727 and 731 may be electrically coupled to first and second isolated electrode layers 119A and 119B through a first electrode pad 121A and a second electrode pad 121B, respectively. An insulating layer 123 may be further formed between the first electrode pad 121A and the second electrode pad 121B.

The substrate main body 725 may be a circuit board, such as a printed circuit board (PCB), a metal core PCB (MCPCB), a metal PCB (MPCB), or a flexible PCB (FPCB), or a ceramic substrate including AlN or $Al_2O_3$. In some example embodiments, a structure including a lead frame may be adopted instead of the package substrate 620.

Each of the TSVs 729 and a plurality of conductive layers (e.g., conductive layers 727, and 731) may include copper (Cu), gold (Au), silver (Ag), nickel (Ni), tungsten (W), chromium (Cr), or a combination thereof.

FIG. 13 illustrates an example in which the semiconductor light-emitting device 100 described with reference to FIGS. 1A to 1C is mounted on the package substrate 620, but the inventive concepts are not limited thereto. In some example embodiments, the semiconductor light-emitting device 600 may have a structure in which at least one of the semiconductor light-emitting devices 100', 200, 300, 400, and 500 described with reference to FIGS. 3A to 7 is mounted on the package substrate 620. In some example embodiments, the package substrate may include a top surface that is proximate to a top surface of an electrode layer. The package substrate top surface may be coupled to the electrode layer top surface according to a flip-chip.

Although not shown, a wavelength conversion layer may be further provided on the substrate 101. The wavelength conversion layer may serve to convert a wavelength of light generated by the emission structure 103 into another wavelength. In some example embodiments, the wavelength conversion layer may include a resin layer including phosphors or quantum dots.

The semiconductor light-emitting devices 100, 100', 200, 300, 400, 500, and 600 according to some example embodiments should not be construed as limited to the particular shapes of regions illustrated herein but are to include deviations in shapes that result, for example, from manufacturing. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 14A:
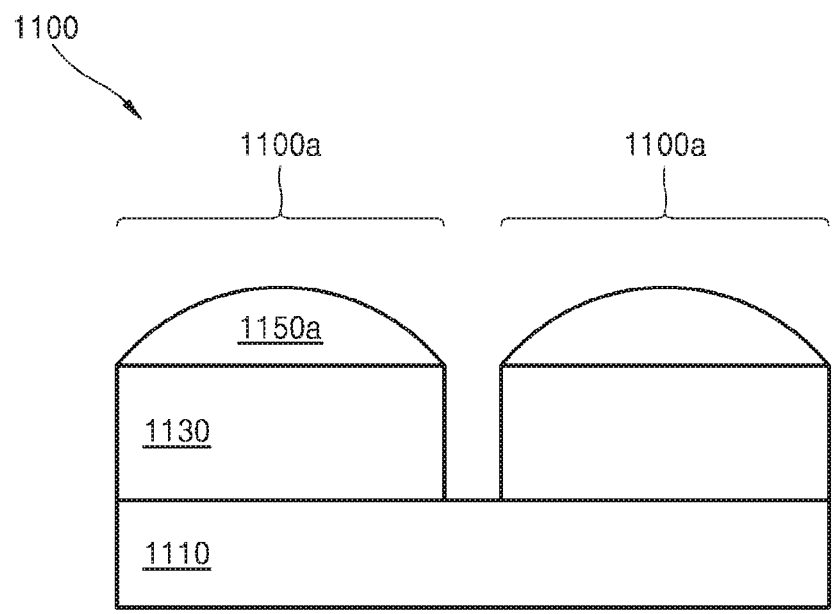
FIG. 14A and FIG. 14B are schematic cross-sectional views of white light source modules including semiconductor light-emitting devices according to some example embodiments.
Figure 14B:
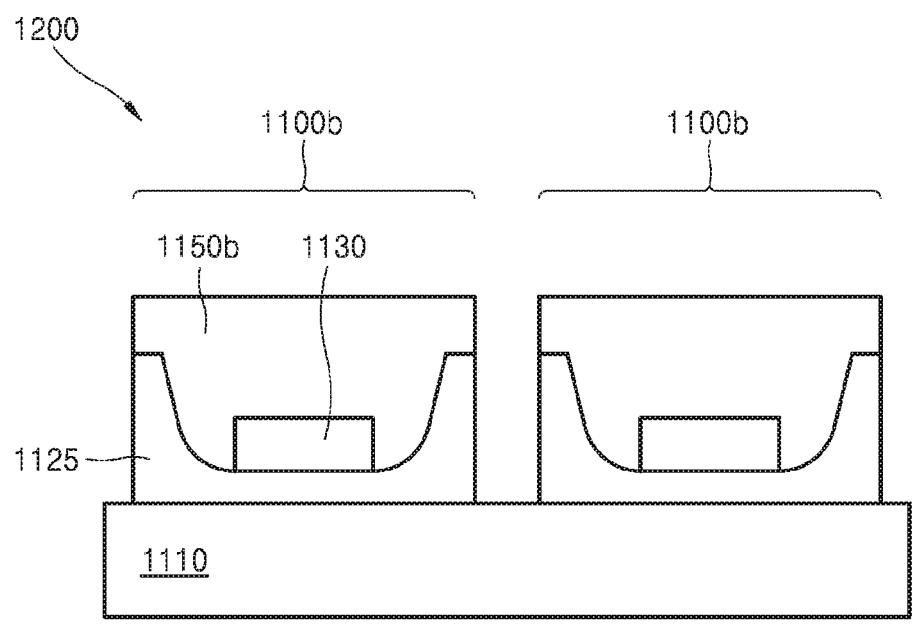

FIGS. 14A and 14B are schematic cross-sectional views of white light source modules 1100 and 1200 including semiconductor light-emitting devices according to some example embodiments.

Referring to FIG. 14A, the white light source module 1100 for a liquid crystal display (LCD) backlight (BL) may include a circuit substrate 1110 and a plurality of white light-emitting devices 1100a mounted on the circuit substrate 1110. A conductive pattern may be formed on a top surface of the circuit substrate 1110 and coupled to the white light-emitting device 1100a.

Each of the white light-emitting devices 1100a may include a semiconductor light-emitting device 1130 configured to emit blue light, and the semiconductor light-emitting device 1130 may be directly mounted on the circuit substrate 1110 in a chip-on-board (COB) manner. The semiconductor light-emitting device 1130 may be one of the semiconductor light-emitting devices 100, 100', 200, 300, 400, and 500 according to the above-described embodiments. Each of the white light-emitting devices 1100a may include a wavelength converter (or a wavelength conversion layer) 1150a, which may have a hemispherical shape functioning as a lens and provide a wide view angle, which may contribute toward reducing a thickness or width of an LCD.

Referring to FIG. 14B, the white light source module 1200 for an LCD BL may include a circuit substrate 1110 and a plurality of white light light-emitting devices 1100b mounted on the circuit substrate 1110. Each of the white light light-emitting devices 1100b may include a semiconductor light-emitting device 1130, which may be mounted in a reflection cup of a package main body 1125 and configured to emit blue light, and a wavelength converter 1150b configured to encapsulate the semiconductor light-emitting device 1130. The semiconductor light-emitting device 1130 may be at least one of the semiconductor light-emitting devices 100, 100', 200, 300, 400, and 500 according to the above-described embodiments.

In some example embodiments, the wavelength converters 1150a and 1150b may contain wavelength conversion materials such as phosphors and/or quantum dots.

The white light source module 1200 may include at least one of the semiconductor light-emitting devices 100, 100', 200, 300, 400, and 500 according to the above-described embodiments. The white light source module 1200 may be used as a light source for lighting apparatuses, such as a backlight unit (BLU), a display device, a flat-panel lighting apparatus, a bar-type lighting apparatus, and a bulb-type lamp. In addition, the white light source module 1200 may further include a communication module and constitute a complex smart illumination-network system into which Internet of Things (IoT) technology and wireless communication technology are converged.

While the inventive concepts has been particularly shown and described with reference to embodiments thereof, it will be understood that various changes in form and details may be made therein without departing from the spirit and scope of the following claims.

What is claimed is:

1. A semiconductor light-emitting device, comprising:
an emission structure including a first semiconductor layer, a second semiconductor layer, and an active layer between the first semiconductor layer and the second semiconductor layer;
a protection pattern layer on a region of the emission structure;
a first insulating pattern layer on the emission structure, the first insulating pattern layer including an opening, such that the emission structure is covered by at least one of the first insulating pattern layer and the protection pattern layer; and
an electrode layer on the protection pattern layer in the opening, on the first insulating pattern layer, and on the second semiconductor layer, wherein the electrode layer has a plan view area greater than a plan view area of the protection pattern layer.

2. The device of claim 1, wherein,
the opening of the first insulating pattern layer overlaps a portion of a surface of the emission structure, such that the protection pattern layer and the first insulating pattern layer cover a top surface of the emission structure.

3. The device of claim 1, wherein,
the protection pattern layer includes a plurality of protection patterns spaced apart from one another, and
the first insulating pattern layer includes a plurality of openings that at least partially overlap with the plurality of protection patterns, respectively.

4. The device of claim 1, wherein the protection pattern layer includes an insulating material.

5. The device of claim 1, wherein the protection pattern layer includes a metal material.

6. The device of claim 1, further comprising:
a current diffusion layer on a top surface of the emission structure, a side surface of the protection pattern layer, and the top surface of the protection pattern layer, the current diffusion layer including a conductive material.

7. The device of claim 1, wherein,
the first insulating pattern layer includes a material associated with a lower refractive index than a refractive index associated with the second semiconductor layer, and
the first insulating pattern layer is a single film or a multilayered structure.

8. The device of claim 1, further comprising:
an adhesive layer between the first insulating pattern layer and the electrode layer.

9. The device of claim 1, further comprising:
a second insulating pattern layer on the electrode layer, the second insulating pattern layer including an opening on a top surface of the electrode layer.

10. A semiconductor light-emitting device, comprising:
an emission structure including a first semiconductor layer, a second semiconductor layer, and an active layer between the first semiconductor layer and the second semiconductor layer;
a protection pattern layer on a limited region of the emission structure,
an insulating pattern layer on the emission structure and the protection pattern layer, the insulating pattern layer including an opening penetrating the insulating pattern layer, wherein the opening is above a top surface of the protection pattern layer such that the emission structure is covered by at least one of the insulating pattern layer and the protection pattern layer; and
an electrode layer on the protection pattern layer and on the opening, on the insulating pattern layer, and on the second semiconductor layer, wherein the electrode layer has a plan view area greater than a plan view area of the protection pattern layer.

11. The device of claim 10, wherein the protection pattern layer includes an insulating material.

12. The device of claim 10, wherein the protection pattern layer includes a metal material.

13. The device of claim 10, further comprising:
a current diffusion layer on a top surface of the emission structure, a side surface of the protection pattern layer, and the top surface of the protection pattern layer, the current diffusion layer including a conductive material.

14. A semiconductor light-emitting device, comprising:
an emission structure, the emission structure configured to generate a wavelength of light;
a protection pattern layer on a limited region of the emission structure, the protection pattern layer having a refractive index, the protection pattern layer having a thickness substantially equal to or greater than one-half of a ratio of the wavelength of light that the emission structure is configured to generate to the refractive index of the protection pattern layer; and an insulating pattern layer on the emission structure, the insulating pattern layer including an opening penetrating the insulating pattern layer, wherein the opening is above the protection pattern layer, such that the emission structure is covered by at least one of the insulating pattern layer and the protection pattern layer.

15. The device of claim 14, further comprising:
a current diffusion layer on the emission structure and the protection pattern layer, the current diffusion layer including a conductive material.

16. The device of claim 14, wherein the protection pattern layer includes an insulating material.

17. The device of claim 14, wherein the protection pattern layer includes a metal material.

18. The device of claim 14, wherein a boundary of an inner wall of the opening is substantially common with a boundary of a side surface of the protection pattern layer in a direction substantially perpendicular to a top surface of the emission structure.

19. The device of claim 14, wherein,
the protection pattern layer includes a plurality of protection patterns spaced apart from one another, and
the insulating pattern layer includes a plurality of openings that at least partially overlap with the plurality of protection patterns, respectively.

20. The device of claim 14, further comprising:
a package substrate, the package substrate including a top surface that is proximate to a top surface of an electrode layer;
wherein the package substrate top surface is coupled to the electrode layer top surface according to a flip-chip.

* * * * *